(12) United States Patent
Guo et al.

(10) Patent No.: US 10,746,933 B2
(45) Date of Patent: Aug. 18, 2020

(54) FIBER COUPLED LASER SOURCE PUMP WITH WAVELENGTH DIVISION MULTIPLEXER, ISOLATOR, TAP FILTER, AND PHOTODETECTOR

(71) Applicant: Lumentum Operations LLC, Milpitas, CA (US)

(72) Inventors: Yonghong Guo, Union City, CA (US); Nicolas Guerin, San Jose, CA (US); Chang Xiao, Shenzhen (CN); Xia Hong, Milpitas, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 16/335,232

(22) PCT Filed: Jun. 1, 2017

(86) PCT No.: PCT/CN2017/086846
§ 371 (c)(1),
(2) Date: Mar. 20, 2019

(87) PCT Pub. No.: WO2018/054088
PCT Pub. Date: Mar. 29, 2018

(65) Prior Publication Data
US 2019/0250336 A1    Aug. 15, 2019

(30) Foreign Application Priority Data
Sep. 22, 2016   (WO) ................ PCT/CN2016/099681

(51) Int. Cl.
*H04B 10/00*    (2013.01)
*G02B 6/293*    (2006.01)
(Continued)

(52) U.S. Cl.
CPC ....... *G02B 6/29361* (2013.01); *G02B 6/2938* (2013.01); *H01S 3/0064* (2013.01);
(Continued)

(58) Field of Classification Search
CPC ......... H01S 5/005; H01S 5/0064; G02B 6/42; G02B 6/4201; G02B 6/4204; G02B 6/4215
See application file for complete search history.

(56) References Cited

U.S. PATENT DOCUMENTS 6,236,497 B1   5/2001   Andersen et al.
6,480,331 B1   11/2002  Cao
(Continued)

FOREIGN PATENT DOCUMENTS

CN   1373920 A    10/2002
CN   101211087 A  7/2008

OTHER PUBLICATIONS

International Search Report and Written Opinion—PCT/CN2017/086846—ISA/EPO—dated Aug. 25, 2017.

*Primary Examiner* — Daniel G Dobson
(74) *Attorney, Agent, or Firm* — Harrity & Harrity, LLP

(57) ABSTRACT

A pump laser package may include an input fiber to send signal light on a first optical path inside a package, a source to send pump light on a second optical path inside the package, and an output fiber on a third optical path inside the package. The pump laser package may include a WDM filter inside the package to receive the signal light on the first optical path and send the signal light on the third optical path, and receive the pump light on the second optical path and send the pump light on the third optical path. The pump laser package may include an isolator inside the package to transmit the signal light in a first direction, and block the (Continued)

signal light in a second direction, or a photo-diode to receive a portion of the signal light sent on a fourth optical path.

20 Claims, 18 Drawing Sheets

(51) Int. Cl.

| | | |
|---|---|---|
| *H01S 3/094* | (2006.01) | |
| *H01S 3/0941* | (2006.01) | |
| *H01S 5/022* | (2006.01) | |
| *H01S 3/00* | (2006.01) | |
| *H01S 3/067* | (2006.01) | |
| *H04B 10/67* | (2013.01) | |
| *H04J 14/02* | (2006.01) | |
| *H04J 14/00* | (2006.01) | |
| *H01S 5/14* | (2006.01) | |
| *H01S 5/00* | (2006.01) | |
| *H01S 5/40* | (2006.01) | |

(52) U.S. Cl.
CPC ........ *H01S 3/06754* (2013.01); *H01S 3/0941* (2013.01); *H01S 3/094053* (2013.01); *H01S 5/02284* (2013.01); *H04B 10/675* (2013.01); *H04J 14/0227* (2013.01); *H01S 3/094061* (2013.01); *H01S 5/005* (2013.01); *H01S 5/0064* (2013.01); *H01S 5/02212* (2013.01); *H01S 5/146* (2013.01); *H01S 5/40* (2013.01)

(56) References Cited

U.S. PATENT DOCUMENTS

| | | | |
|---|---|---|---|
| 7,440,163 B1 | 10/2008 | Zhou et al. | |
| 7,813,040 B2 | 10/2010 | Colbourne et al. | |
| 2003/0068119 A1* | 4/2003 | Xie | G02B 6/2552 385/24 |
| 2004/0032644 A1 | 2/2004 | Griffin | |
| 2006/0001949 A1* | 1/2006 | Sakaguchi | H01S 3/06704 359/333 |
| 2009/0290212 A1* | 11/2009 | Jiang | G02B 27/144 359/341.3 |

* cited by examiner ically sensitive to bend radius issues that may introduce loss) and multiple fiber splices (that may introduce additional loss). # FIBER COUPLED LASER SOURCE PUMP WITH WAVELENGTH DIVISION MULTIPLEXER, ISOLATOR, TAP FILTER, AND PHOTODETECTOR

CROSS-REFERENCE TO RELATED APPLICATION

This application is a 371 national stage of PCT Application No. PCT/CN2017/086846 filed on Jun. 1, 2017 entitled "FIBER COUPLED LASER SOURCE PUMP WITH WAVELENGTH DIVISION MULTIPLEXER, ISOLATOR, TAP FILTER, AND PHOTODETECTOR," which claims priority to PCT Application No. PCT/CN2016/099681, filed on Sep. 22, 2016 entitled "FIBER COUPLED LASER SOURCE PUMP WITH WAVELENGTH DIVISION MULTIPLEXER, ISOLATOR, TAP FILTER, AND PHOTODETECTOR," which are incorporated by reference herein.

TECHNICAL FIELD

The present disclosure relates to optical amplifier systems for data communications and telecommunications and, more particularly, to a pump laser package that provides a signal and a pumping beam as a combined optical signal while performing additional optical functions, conserving space, reducing size of optical components of optical amplifier systems, simplifying configuration and/or construction of optical amplifier systems, and/or reducing cost of implementing optical amplifier systems.

BACKGROUND

An optical amplifier for data communications and telecommunications may include discrete components for a pump laser, an isolator, a wavelength division multiplexer (WDM), a tap, a monitor, a photodetector, an isolator, and/or the like. These discrete components may be interconnected by fiber splicing together with the signal fiber. Managing these discrete components, the fibers, and the splices necessitates space, requires routing fiber (which may be sensitive to bend radius issues that introduce loss), and requires multiple fiber splices (which may introduce additional loss).

SUMMARY

According to some possible implementations, a pump laser package, may include: an input fiber to send signal light on a first optical path in free-space inside a package; a source to send pump light on a second optical path in free-space inside the package; an output fiber on a third optical path in free-space inside the package; a wavelength division multiplexing (WDM) filter inside the package to: receive the signal light on the first optical path and send the signal light on the third optical path, and receive the pump light on the second optical path and send the pump light on the third optical path; and an isolator inside the package to: transmit the signal light in a first direction on the first optical path, and block the signal light in a second direction on the first optical path.

According to some possible implementations, a pump laser package may include: an input fiber to send signal light on a first optical path in free-space inside a package; a source to send pump light on a second optical path in free-space inside the package; an output fiber on a third optical path in free-space inside the package; a WDM filter to: receive the signal light on the first optical path, send a first portion of the signal light on the third optical path, and send a second portion of the signal light on a fourth optical path in free-space inside the package, and receive the pump light on the second optical path and send the pump light on the third optical path; and a photo-diode to receive the second portion of the signal light on the fourth optical path.

According to some possible implementations, a pump laser package may include: a first fiber to send signal light on a first optical path in free-space inside a package; a source to send pump light on a second optical path in free-space inside the package; a second fiber on a third optical path in free-space inside the package; and a WDM filter inside the package to: receive the signal light on the first optical path and send the signal light on the third optical path, and receive the pump light on the second optical path and send the pump light on the first optical path.

DETAILED DESCRIPTION

Figure 1:
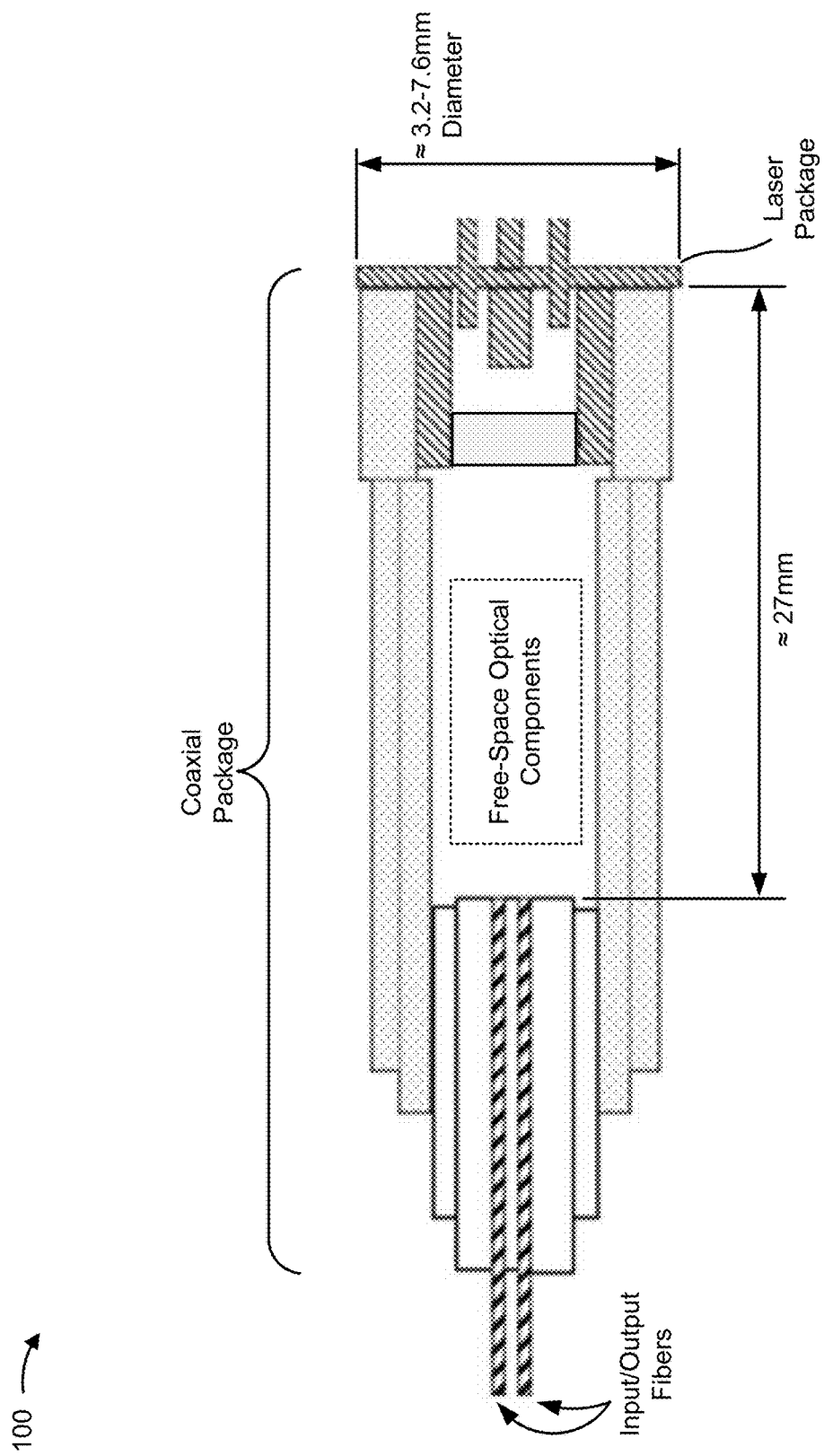
FIG. 1 is a diagram of an example pump laser package in which components, devices, and/or systems described herein may be implemented.

The following detailed description of example implementations refers to the accompanying drawings. The same reference numbers in different drawings may identify the same or similar elements. The implementations described below are merely examples and are not intended to limit the implementations to the precise forms disclosed. Instead, the implementations were selected for description to enable one of ordinary skill in the art to practice the implementations.

A prior optical amplifier system includes discrete components for a pump laser, an isolator, a wavelength division multiplexer (WDM), a tap, a monitor, a photodetector (PD), or the like, associated with performing optical functions. These discrete components may be interconnected by fiber splicing together with a signal fiber associated with the optical signal that is to be amplified by the optical amplifier system. However, managing these discrete components, the fibers, and the splices may require physical space, routing fiber (which may be sensitive to bend radius issues that introduce loss), and/or multiple fiber splices (which may introduce additional loss).

Additionally, in a prior optical amplifier system where integration of a pump laser and a WDM within a package is possible, alignment sensitivity when arranging and/or fixing components of the optical amplifier system in place within the package may be significant, thereby decreasing manufacturability and/or increasing cost of the optical amplifier system in order to ensure that acceptable alignment is achieved. For example, such a prior optical amplifier system includes a pair of collimating lenses, where one collimating lens is a GRIN lens arranged between a fiber and the WDM, and another (single) collimating lens is arranged between the laser diode and the WDM. However, alignment of components of the prior optical amplifier system is sensitive with respect to five degrees of freedom (e.g., an x-direction, a y-direction, a z-direction, a polar angle ($\theta$), and an azimuthal angle ($\varphi$) during manufacture and/or assembly.

Moreover, in the prior optical amplifier system using the single collimating lens arranged between the laser diode and the WDM, a welding joint (e.g., a laser welding joint), associated with assembling and/or manufacturing the prior optical amplifier system, is located at a plane corresponding to the laser diode. Location of the welding joint at the laser diode plane results in significant sensitivity with respect alignment in the x-direction, the y-direction, and the z-direction when assembling and/or manufacturing the prior optical amplifier system. Thus, manufacturing of the prior optical amplifier system and/or ensuring reliability of the prior optical amplifier system may be difficult and/or costly in order to ensure that acceptable alignment with respect to one or more degrees of freedom is achieved.

Implementations described herein provide various implementations of a pump laser that provides a signal and a pumping beam as a combined optical signal, while performing one or more additional optical functions. Advantages of the implementations described herein may include reducing use of physical space by the optical amplifier system, reducing a number of fibers in the optical amplifier system, reducing a number of fiber splices of the optical amplifier system, reducing size of optical components of the optical amplifier system, simplifying configuration and/or construction of the optical amplifier system, increasing manufacturability of the optical amplifier system, and/or reducing cost of implementing the optical amplifier system (e.g., as compared to a prior optical amplifier system that includes discrete components).

Further advantages of the implementations described herein may include reducing alignment sensitivity of the optical amplifier system such that alignment of the components of the optical amplifier system is sensitive with respect to only three degrees of freedom. Additionally, the optical amplifier systems described herein achieve reduced sensitivity with respect to the five degrees of freedom. Such reduced alignment sensitivity increases manufacturability, increases reliability, and/or reduces cost of the optical amplifier system (e.g., as compared to the prior optical amplifier system that includes a single collimating lens arranged between the pump laser and the WDM).

FIG. 1 is a diagram of an example pump laser package 100 in which components, devices, and/or systems described herein may be implemented. In some implementations, pump laser package 100 can realize integration of functional components of an optical amplifier system in a single coaxial package, as described herein. By doing so, discrete and/or bulky optical components such as a pump laser and a WDM (e.g., a 980/1550 WDM filter) may be integrated in a compact package, resulting in significant space saving (e.g., as compared to a prior optical amplifier system). Moreover, labor-intensive fiber splicing among discrete optical components are not needed. As such, small form factor modules, such as an optical amplifier layout in an ultra-small CFPx transmission module, are enabled. In some implementations, pump laser package 100 allows for integration of a hermetically sealed pump laser with four or more other Erbium Doped Fiber Amplifier (EDFA) functional components inside a same fiber-pig-tailed package.

As shown in FIG. 1, in some implementations, pump laser package 100 includes a hermetic sealed portion (e.g., a TO-can or a laser package, as labeled in FIG. 1) that includes a pump laser. In some implementations, the hermetic sealed portion may also include a photodetector and/or one or more other components.

As further shown, pump laser package 100 includes a coaxial package (which may be non-hermetic) between the TO-can and a pair of optical fibers (e.g., an input and an output fiber). As shown, in some implementations, the coaxial package may contain free-space optical components (e.g., between the TO-can and the ends of the fibers) associated with performing one or more optical functions, as described in further detail below.

In some implementations, the coaxial package may have a diameter less than 10 mm. For example, the diameter of the coaxial package may be in a range from approximately 3.2 millimeters (mm) to approximately 7.6 mm. In some implementations, a magnetic ring, included in the coaxial package (not shown), may have an outer diameter of approximately 2 mm (e.g., when the diameter of the coaxial package is approximately 6.6 mm).

In some implementations, a length of the coaxial package, including a TO-can header, may be in a range from approximately 20 mm to approximately 40 mm (e.g., a length of 27 mm is shown in FIG. 1).

In some implementations, the coaxial package may taper in diameter from the TO-can to the fibers and/or may be non-circular in cross-section. In some implementations, an optical path length from a pump chip to a facet of the optical fibers may be approximately 13.5 mm (e.g., when the length of the coaxial package is approximately 27 mm).

In some implementations, a pump laser that utilizes pump laser package 100 may have an output power in a range from approximately 50 milliwatts to approximately 150 milliwatts, may be used in a C-band single channel application, may be used in a narrow channel count application, and/or may be implemented in association with an EDFA.

In some implementations, such a pump laser may have a wavelength range of approximately 970 nanometers (nm) to approximately 980 nm, may not require active cooling to operate, and may produce a beam of pump light of up to approximately 150 milliwatts. In some implementations, the pump laser may produce a beam of pump light of up to approximately 200 milliwatts. In some implementations, the pump laser may operate in an environment with a case temperature in a range from approximately 0 degrees Celsius to approximately 70 degrees Celsius. In some implementations, the pump laser may have a thermistor resistance of approximately 10,000 ohms at a temperature of approximately 25 degrees Celsius. In some implementations, the pump laser may have a fiber pigtail bending radius of less than or equal to approximately 16 mm.

The number, arrangement, size, length, diameter, width, or the like, of portions and components of pump laser package 100 shown in FIG. 1 are provided as examples. In practice, pump laser package 100 may include additional portions and/or components, fewer portions and/or components, different portions and/or components, differently arranged portions and/or components, and/or differently sized portions and/or components, than those shown in FIG. 1.

FIGS. 2A-2H are diagrams of example implementations of fiber coupled laser source pumps (herein referred to as pump lasers) 250, 255, 260, 265, 270, 275, and 285 that include a combiner (e.g., a wavelength division multiplexer (WDM) filter) and three lenses in free-space inside a package. Pump lasers 250, 255, 260, 265, 270, 275, and 285 achieve wavelength stabilization of a laser diode and combine a pumping beam and a signal beam into a combined output beam, with reduced alignment sensitivity and/or increased manufacturability, as described herein. In some implementations, pump lasers 250, 255, 260, 265, 270, 275, and 285 may be housed in pump laser package 100. In the example implementations shown in FIGS. 2A-2G, the arrows represent approximate edge rays of respective optical beams.

Figure 2A:
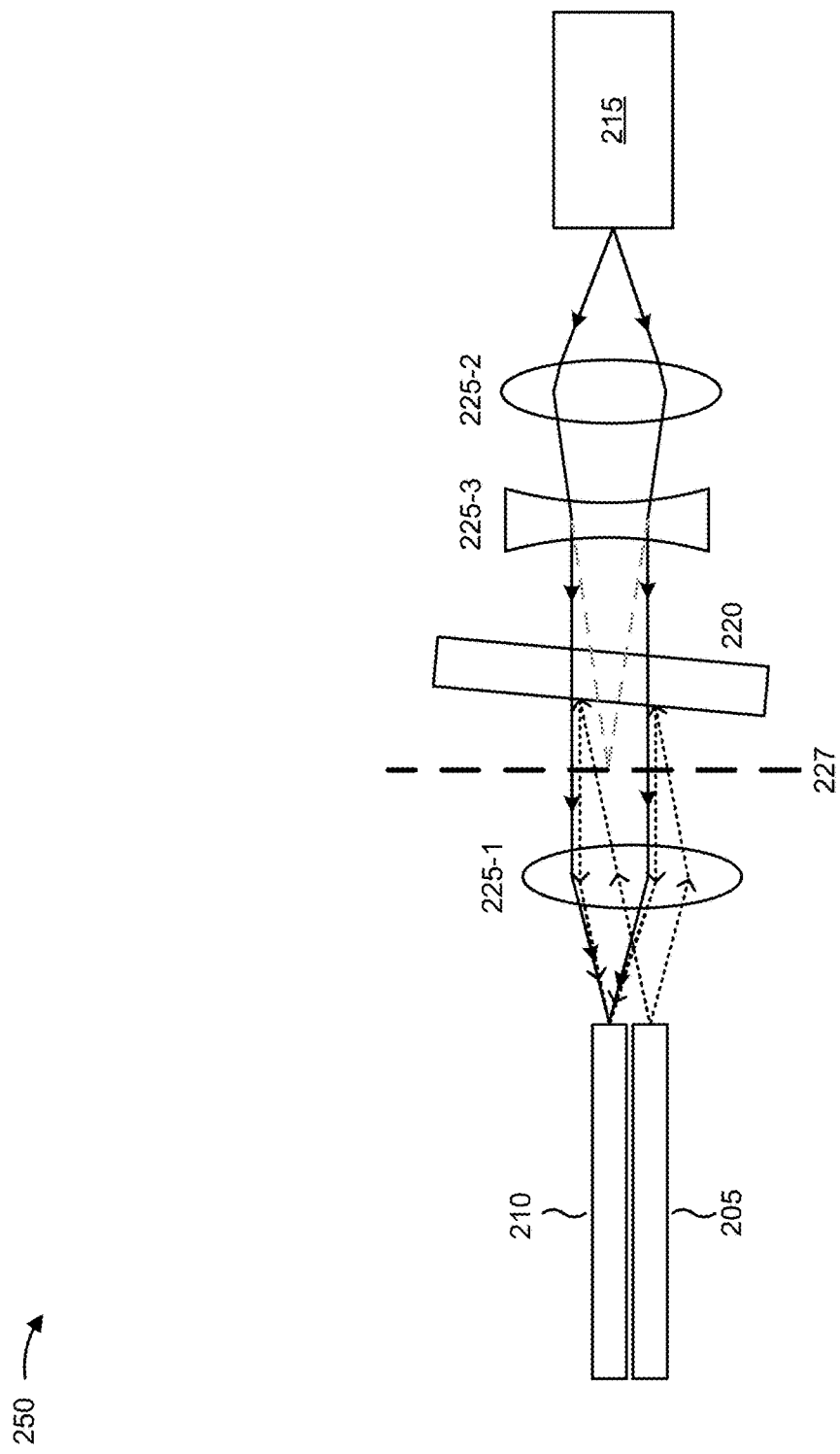
FIGS. 2A-2H are diagrams of example implementations of fiber coupled laser source pumps, including wavelength division multiplexers (WDMs) and three lenses in free-space inside a package, that achieve wavelength stabilization of a laser diode and combine a pumping beam and a signal beam into a combined output beam, with reduced alignment sensitivity and/or increased manufacturability, as described herein.

FIG. 2A is a diagram of an example pump laser 250, including a combiner and three lenses in free-space inside a package, that achieves wavelength stabilization of a laser diode and combines a pumping beam and a signal beam, with reduced alignment sensitivity and increased manufacturability (e.g., as compared to a prior optical amplifier system). As shown in FIG. 2A, pump laser 250 may include an input fiber 205, an output fiber 210, a distributed feedback (DFB) diode 215, a combiner 220, and a lens 225-1, a lens 225-2, and a lens 225-3. Example operation of pump laser 250 is described following descriptions of the example components of pump laser 250.

Input fiber 205 is a fiber for sending signal light (i.e., a beam of signal light) in free-space inside a package of pump laser 250. As shown in FIG. 2A (by the dotted lines pointing in the right direction), input fiber 205 may be arranged such that input fiber 205 sends the signal light on an optical path from a facet of input fiber 205, via lens 225-1, to combiner 220 (herein referred to as a first optical path).

DFB diode 215 is a DFB diode for sending pump light (i.e., a beam of pump light, source light) in the free-space inside the package of pump laser 250. In some implementations, DFB diode 215 is capable of sending the pump light at a particular wavelength (e.g., approximately 980 nm) without receiving any reflected pump light (i.e., DFB diode 215 may achieve wavelength stabilization internally). As shown in FIG. 2A (by the solid lines pointing in the left direction on the right side of combiner 220), DFB diode 215 may be arranged such that DFB diode 215 sends the pump light on an optical path from a facet of DFB diode 215, via lens 225-2 and lens 225-3, to combiner 220 (herein referred to as a second optical path). In some implementations, use of DFB diode 215 may simplify implementation and/or reduce cost as compared to a pump laser that uses a Fabry-Perot diode or another type of diode that requires a lasing cavity external to the laser diode.

Output fiber 210 is a fiber for receiving signal light and pump light (i.e., the signal light combined with the pump light, herein referred to as signal+pump light) via the free-space inside the package of pump laser 250, and outputting the signal+pump light. As shown in FIG. 2A (by the dotted lines pointing in the left direction and the solid lines pointing in the left direction on the left side of combiner 220), output fiber 210 may be arranged such that output fiber 210 receives the signal+pump light on an optical path from combiner 220, via lens 225-1, to a facet of output fiber 210 (herein referred to as a third optical path). As shown, in some implementations, input fiber 205 and output fiber 210 may be arranged in fiber pigtail at a first end of the package of pump laser 250.

Combiner 220 includes a component for combining beams of light by, for example, transmitting (i.e., passing) a first beam of light (e.g., the pump light) and reflecting a second beam of light (e.g., the signal light) based on wavelengths of the beams of light, based on directions of the beams of light, based on sources of the beams of light, or the like. For example, combiner 220 may include a WDM filter, a low-pass filter, a beam combiner, or the like. In some implementations, combiner 220 may transmit light of a wavelength of approximately 980 nm (e.g., pump light), and may reflect light of a wavelength of approximately 1550 nm (e.g., signal light). However, other examples are possible, and combiner 220 may transmit or reflect light of one or more other wavelengths. In some implementations, combiner 220 may be tilted relative to an optical axis of pump laser 250 (e.g., as shown in FIG. 2A) in order to ease alignment of the signal light to output fiber 210.

As shown in FIG. 2A, in some implementations, combiner 220 may be arranged to receive the signal light sent on the first optical path by input fiber 205, and send (reflect) the signal light on the third optical path to output fiber 210. As further shown, combiner 220 may be arranged to receive the pump light sent on the second optical path by DFB diode 215, and send (transmit) the pump light on the third optical path to output fiber 210. As further shown, in some implementations, combiner 220 may be arranged between lens 225-1 and lens 225-3. In some implementations, combiner 220 may be separated from lens 225-1 and lens 225-3 by the free-space inside the package of pump laser 250.

Lens 225-1 includes a lens for collimating a beam of light or focusing a beam of collimated light within the free-space of the package of pump laser 250. For example, functions of lens 225-1 may include collimating the signal light on the first optical path, focusing the pump light on the third optical path, focusing the signal light on the third optical path, or the like. As shown in FIG. 2A, in some implementations, lens 225-1 may be arranged in the free-space of the package on the first optical path and the third optical path (e.g., between fibers 205/210 and combiner 220). In some implementations, lens 225-1 may have a substantially consistent refractive index within a material from which lens 225-1 is composed (i.e., lens 225-1 may not be a gradient index (GRIN) lens).

Lens 225-2 includes a lens for causing a beam of light to converge within the free-space of the package of pump laser 250. For example, as shown in FIG. 2A, a function of lens 225-2 may include causing the pump light, sent by DFB diode 215, to converge on a portion of the second optical path (e.g., on a portion of the second optical path from lens 225-2 to lens 225-3). As shown in FIG. 2A, in some implementations, lens 225-2 may be arranged in the free-space of the package on the second optical path (e.g., between DFB diode 215 and lens 225-3).

Lens 225-3 includes a negative lens for collimating a converging beam of light within the free-space of the package of pump laser 250. For example, as shown in FIG. 2A, a function of lens 225-3 may include collimating the pump light (e.g., after passing through lens 225-2) such that the pump light is collimated on a portion of the second optical path (e.g., on a portion of the second optical path from lens 225-3 to combiner 220). As shown in FIG. 2A, in some implementations, lens 225-3 may be arranged in the free-space of the package on the second optical path (e.g., between lens 225-2 and combiner 220).

In some implementations, lens 225-3 and lens 225-1 may be arranged such that a virtual image, associated with the pump light on the second optical path, is located at virtual image plane 227 (e.g., a plane perpendicular to the optical axis, shown as a dashed vertical black line in FIG. 2A) in the free-space of the package. For example, as shown in FIG. 2A (e.g., by the dashed gray lines that converge to a point at the dashed black line), lens 225-3 and lens 225-1 may be arranged such that a virtual image, associated with the pump light, is located at virtual image plane 227 (e.g., located between lens 225-1 and combiner 220). In some implementations, lens 225-3 and lens 225-1 may be arranged such that virtual image plane 227 is located at another point within the free-space of the package.

In some implementations, alignment sensitivity of pump laser 250 may be reduced by use of discrete lenses 225-2 and 225-3 on the second optical path (e.g., as compared to the prior optical amplifier system that uses a single collimating lens between the laser diode and the combiner). For example, in some implementations, use of lenses 225-2 and 225-3 within the free-space of the package of pump laser 250 reduces alignment sensitivity of components of pump laser 250 such that pump laser 250 is sensitive to alignment changes with respect to only three degrees of freedom (e.g., alignments with respect to three orthogonal directions, such as an x-direction, a y-direction, and a z-direction). Here, since use of discrete lenses 225-2 and 225-3 allows for a virtual image to be created at virtual image plane 227, a welding joint plane (e.g., a laser welding joint plane) may be located at virtual image plane 227, which reduces and/or eliminates sensitivity to alignments associated with angular degrees of freedom (e.g., alignments with respect to a polar angle, an azimuthal angle, etc.) since all light from the virtual image point will be imaged to a receiving fiber, regardless of its incident angle. Thus, manufacturability of pump laser 250 may be increased and/or a cost of pump laser may be reduced due to the use of discrete lenses 225-2 and 225-3 (e.g., as compared to the prior optical amplifier system that includes a single lens). In some implementations, the weld joint may be near to the virtual image plane 227 reducing sensitivity, but not necessarily reducing sensitivity as much as in implementations where the weld joint may be at the virtual image plane 227. In some implementations, the welding joint, associated with manufacturing or assembling pump laser 250 may be located between output fiber 210 and combiner 220. In an assembly process associated with pump laser 250, a first section of pump laser 250 (e.g., including input fiber 205, output fiber 210, lens 225-1, combiner 220, and lens 225-3), and second section of pump laser 250 (e.g., including DFB diode 215 and lens 225-2) are (separately) built, and then the first section and the second section are welded together at the welding joint. The welding joint is selected to be at or near virtual image plane 227. Assembling pump laser 250 in this manner reduces alignment sensitivity of pump laser 250.

Moreover, alignment sensitivity of pump laser 250 (e.g., with respect to the x-direction, the y-direction, and the z-direction) may be reduced based on the creation of the virtual image at virtual image plane 227. For example, the virtual image created at virtual image plane 227 may be larger than a physical size of the source of the pump light at DFB diode. Here, since alignment sensitivity in the x-direction, the y-direction, and the z-direction is depends on image size, the alignment sensitivity in the x-direction, the y-direction, and/or the z-direction may be reduced (since the virtual image is enlarged).

Figure 3:
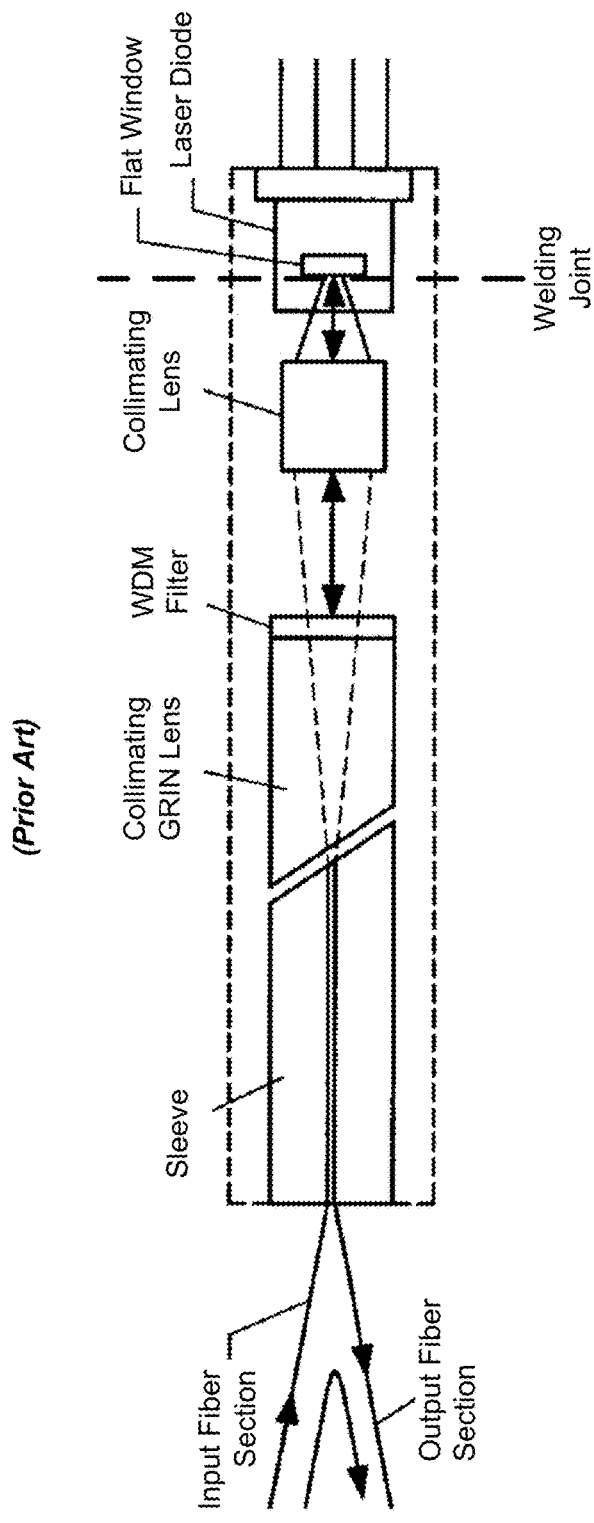
FIG. 3 is a diagram of a prior optical amplifier system that includes a single lens arranged between a WDM and a laser diode.

Conversely, as described above and as shown in FIG. 3, for the prior optical amplifier system that uses the single lens between a combiner and a diode, a welding joint plane (e.g., a laser welding joint plane), associated with manufacturing and/or assembling the prior optical amplifier system, is located at a plane corresponding to the diode. As shown in FIG. 3, use of a single lens arranged between the diode and the combiner does not create a virtual image, associated with the pump light, within the free-space of the package. Therefore, as shown in FIG. 3, a welding joint, associated with manufacturing and/or assembling the prior optical amplifier system of FIG. 3, is located at a plane corresponding to the laser diode facet (e.g., rather than within the free-space inside the package). Since the near field is smallest at the laser diode facet plane, the prior optical amplifier will be more sensitive to misalignment at the welding joint.

However, returning to FIG. 2A, lens 225-3 and lens 225-1 may be arranged to create a virtual image, associated with the pump light, at virtual image plane 227. In this case, a welding joint, associated with manufacturing and/or assembling pump laser 250, may be located at virtual image plane 227. In some implementations, as described above, locating the welding joint at virtual image plane 227 (e.g., between lens 225-1 and combiner 220) reduces alignment sensitivity in the x-direction, the y-direction, and the z-direction (e.g., by a factor of two, by a factor of three, or the like), as compared to the prior optical amplifier system shown in FIG. 3, and/or removes alignment sensitivity with respect to angular degrees of freedom (e.g., thus obviating a need for angular alignment), thereby increasing manufacturability and/or reducing cost of pump laser 250.

In some implementations, the facet of input fiber 205, the facet of output fiber 210, combiner 220, lens 225-1, lens 225-2, and/or lens 225-3 may be included in an enclosure that is not hermetically sealed. Additionally, or alternatively, one or more of the facet of input fiber 205, the facet of output fiber 210, combiner 220, lens 225-1, lens 225-2, and/or lens 225-3 may be enclosed in a hermetically sealed enclosure. In some implementations, lens 225-2 may be used as a hermitic sealing window in a TO-can. In a case where flat glass is used as a hermitic sealing window, then lens 225-2 and lens 225-3 may not be hermetically sealed.

During operation, input fiber 205 sends the signal light (e.g., 1550 nm light) on the first optical path from the facet of input fiber 205 to combiner 220 (e.g., via lens 225-1), and DFB diode 215 sends the pump light (e.g., 980 nm light) on the second optical path from the facet of DFB diode 215 to combiner 220 (e.g., via lens 225-2 and 225-3). Combiner 220 reflects the signal light, received on the first optical path, onto the third optical path (e.g., from combiner 220, via lens 225-1, to the facet of output fiber 210), while simultaneously transmitting the pump light, received on the second optical path, onto the third optical path. Here, by sending the signal light and the pump light on the third optical path, combiner 220 causes the signal light and the pump light to be combined (i.e., to form the signal+pump light) at the facet of output fiber 210. Output fiber 210 then outputs the signal+pump light.

Figure 2B:
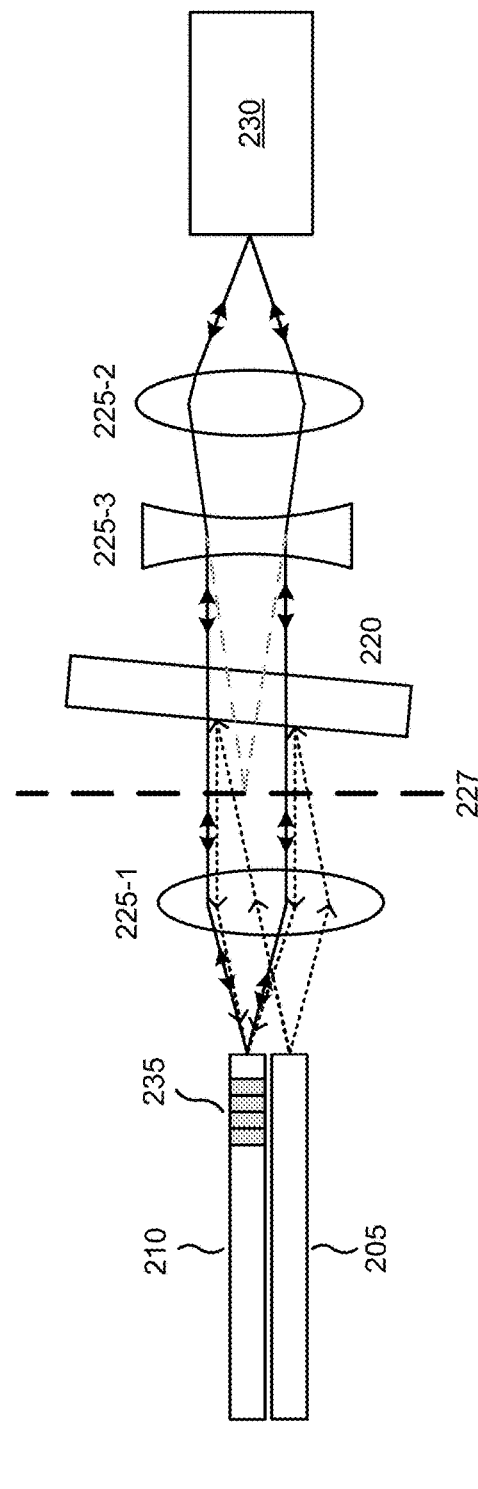

FIG. 2B is a diagram of an example pump laser 255, including a combiner and three lenses in free-space inside a package, that achieves wavelength stabilization of a laser diode and combines a pumping beam and a signal beam, with reduced alignment sensitivity and increased manufacturability. As shown in FIG. 2B, pump laser 255 may include input fiber 205, output fiber 210, combiner 220, lens 225-1, lens 225-2, lens 225-3, a Fabry-Perot (FP) diode 230, and a fiber Bragg grating (FBG) 235. Input fiber 205, output fiber 210, combiner 220, lens 225-1, lens 225-2, and lens 225-3 may be arranged and/or may operate in a similar manner as described above.

FP diode 230 is an FP diode for sending the pump light (i.e., source light) in the free-space inside the package of pump laser 255. In some implementations, FP diode 230 sends the pump light with a particular wavelength (e.g., approximately 980 nm) based on a portion of the pump light reflected back to FP diode 230 by FBG 235. In other words, the wavelength of the pump light sent by FP diode 230 may be stabilized by FBG 235. As shown in FIG. 2B (by the solid lines pointing in the left direction on the right side of combiner 220), FP diode 230 may be arranged such that FP diode 230 sends the pump light on the second optical path (e.g., from a facet of FP diode 230, via lens 225-2 and lens 225-3, to combiner 220). The combiner 220 then sends the pump light on the third optical path, as described in greater detail below.

FBG 235 is a fiber Bragg grating, integrated in output fiber 210, for partially reflecting (i.e., reflecting a portion of) the pump light, sent by FP diode 230, in order to stabilize the wavelength of the pump light sent by FP diode 230 in the free-space of the package of pump laser 255 (e.g., such that FP diode 230 sends pump light with a wavelength of approximately 980 nm). For example, FBG 235 may take the form of a periodic or aperiodic perturbation of an effective refractive index in a core of output fiber 210 that causes light of a particular wavelength (e.g., 980 nm) to be partially reflected. In some implementations, FBG 235 may include another type of grating.

During operation, input fiber 205 sends the signal light (e.g., 1550 nm light) on the first optical path from the facet of input fiber 205 to combiner 220 (e.g., via lens 225-1), and FP diode 230 sends the pump light (e.g., 980 nm light) on the second optical path from the facet of FP diode 230 to combiner 220 (e.g., via lens 225-2 and lens 225-3). Combiner 220 reflects the signal light, received on the first optical path, onto the third optical path (e.g., from combiner 220, via lens 225-1, to the facet of output fiber 210), while simultaneously transmitting the pump light, received on the second optical path, onto the third optical path. Here, by sending the signal light and the pump light on the third optical path, combiner 220 causes the signal light and the pump light to be combined (i.e., to form the signal+pump light) at the facet of output fiber 210. Output fiber 210 then outputs the signal+pump light. Additionally, FBG 235 partially reflects the pump light back to FP diode 230 (e.g., in a reverse direction on the third optical path and the second optical path; via lens 225-1, combiner 220, lens 225-3, and lens 225-2) in order to stabilize the wavelength of the pump light sent by FP diode 230.

Figure 2C:
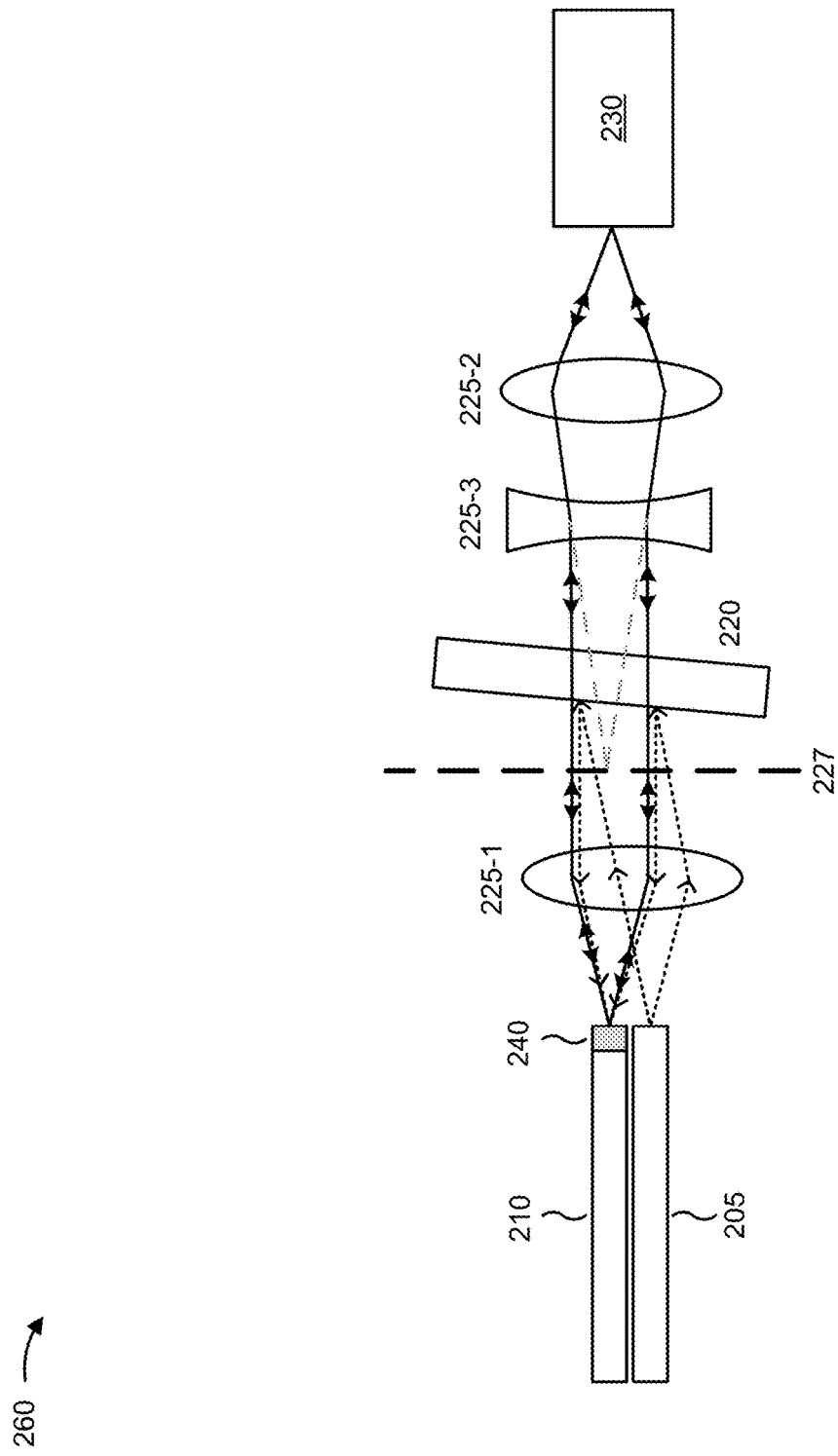

FIG. 2C is a diagram of an example pump laser 260, including a combiner and three lenses in free-space inside a package, that achieves wavelength stabilization of a laser diode and combines a pumping beam and a signal beam, with reduced alignment sensitivity and/or increase manufacturability. As shown in FIG. 2C, pump laser 260 may include input fiber 205, output fiber 210, combiner 220, lens 225-1, lens 225-2, lens 225-3, FP diode 230, and a reflective narrowband device 240. Input fiber 205, output fiber 210, combiner 220, lens 225-1, lens 225-2, lens 225-3, and FP diode 230 may be arranged and/or may operate in a similar manner as described above.

Reflective narrowband device 240 is a component for partially reflecting the pump light, sent by FP diode 230, in order to stabilize the wavelength of the pump light sent by FP diode 230 in the free-space of the package of pump laser 255 (e.g., such that FP diode 230 sends pump light with a wavelength of approximately 980 nm). In some implementations, reflective narrowband device 240 may be in the form of a coating on a surface, within the free-space of the package of pump laser 260, upon which the pump light is incident. For example, as shown in FIG. 2C, reflective narrowband device 240 may be in the form of a coating on the facet of output fiber 210 on which the signal+pump light is incident. In some implementations, such a coating may be applied to an additional surface and/or a different surface in the package of pump laser 260 (e.g., a surface of lens 225-1, a surface of lens 225-2, a surface of lens 225-3, a surface of combiner 220, or the like).

In some implementations, the surface on which the coating is applied may transmit light with wavelengths other than a particular wavelength (e.g., the coating may transmit light with wavelengths other than approximately 980 nm), and may reflect a narrow wavelength band at the particular wavelength (e.g., the coating may reflect light with a wavelength of approximately 980 nm). In some implementations, the surface on which the coating is applied may have approximately 2-4% reflectivity. In this way, the surface of the coating may allow for spectral shaping of FP diode 230.

During operation, input fiber 205 sends the signal light (e.g., 1550 nm light) on the first optical path from the facet of input fiber 205 to combiner 220 (e.g., via lens 225-1), and FP diode 230 sends the pump light (e.g., 980 nm light) on the second optical path from the facet of FP diode 230 to combiner 220 (e.g., via lens 225-2 and lens 225-3). Combiner 220 reflects the signal light, received on the first optical path, onto the third optical path (e.g., from combiner 220, via lens 225-1, to the facet of output fiber 210), while simultaneously transmitting the pump light, received on the second optical path, onto the third optical path. Here, by sending the signal light and the pump light on the third optical path, combiner 220 causes the signal light and the pump light to be combined (i.e., to form the signal+pump light) at the facet of output fiber 210. Output fiber 210 then outputs the signal+pump light. Additionally, reflective narrowband device 240 (e.g., a coating on the facet of output fiber 210) partially reflects the pump light back to FP diode 230 (e.g., in a reverse direction on the third optical path and the second optical path; via lens 225-1, combiner 220, lens 225-3, and lens 225-2) in order to stabilize the wavelength of the pump light sent by FP diode 230.

Figure 2D:
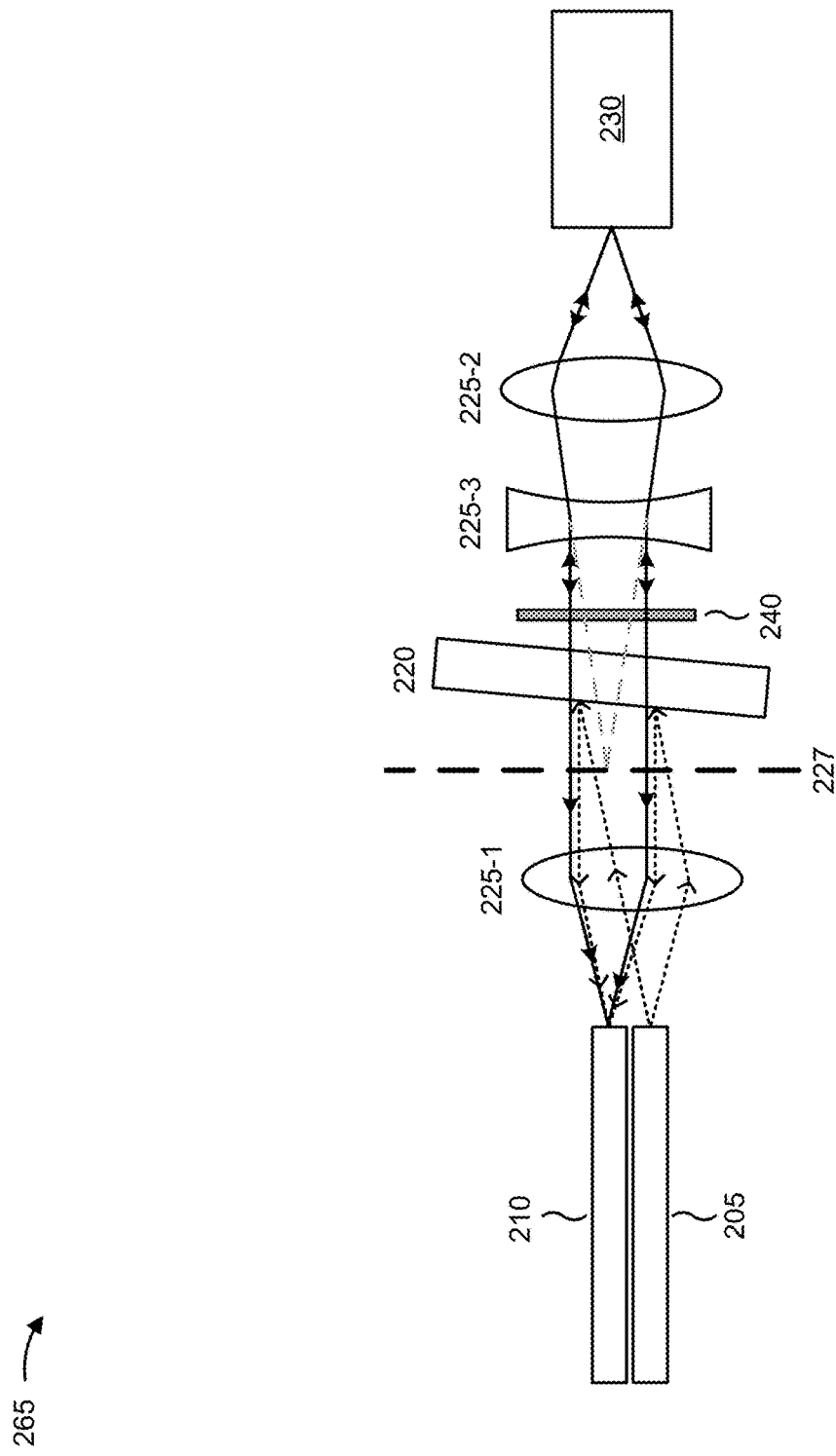

FIG. 2D is a diagram of an example pump laser 265, including a combiner and three lenses in free-space inside a package, that achieves wavelength stabilization of a laser diode and combines a pumping beam and a signal beam, with reduced alignment sensitivity and/or increased manufacturability. As shown in FIG. 2D, pump laser 265 may include input fiber 205, output fiber 210, combiner 220, lens 225-1, lens 225-2, lens 225-3, FP diode 230, and reflective narrowband device 240. Input fiber 205, output fiber 210, combiner 220, lens 225-1, lens 225-2, lens 225-3, FP diode 230, and/or reflective narrowband device 240 may be arranged and/or may operate in a similar manner as described above.

As described above, reflective narrowband device 240 is a component for partially reflecting the pump light, sent by FP diode 230, in order to stabilize the wavelength of the pump light sent by FP diode 230 in the free-space of the package of pump laser 255. In some implementations, as shown in FIG. 2D, reflective narrowband device 240 may be in the form of a discrete component in the free-space inside the package of pump laser 265. For example, reflective narrowband device 240 may be a volume holographic grating (VHG, also known as a volume Bragg grating), a reflective narrowband filter, a passband filter with partial broadband reflector (e.g., with several % reflectivity), or the like. In some implementations, broadband feedback can be provided by one or more other optical surfaces within the package of pump laser 265.

In some implementations, reflective narrowband device 240, when in the form of a discrete component may be arranged on the second optical path (e.g., between combiner 220 and lens 225-3 as shown in FIG. 2D). Additionally, or alternatively, reflective narrowband device 240, when in the form of a discrete component, may be arranged at another location in the free-space of the package, such as at another location on the second optical path (e.g., between lens 225-3 and lens 225-2, between lens 225-2 and the facet of FP diode 230), on the third optical path (e.g., between combiner 220 and lens 225-1, between lens 225-1 and the facet of output fiber 210), and/or on the first optical path. In some implementations, a discrete component reflective narrowband device 240 may simplify large-scale fabrication in a wafer format. In this way, a cost of implementation and an amount of variability between different pump lasers may be reduced.

As shown in FIG. 2D, in some implementations, combiner 220 and the discrete component reflective narrowband device 240 may be angled at a particular relative angle (e.g., in a range of approximately 2 degrees to approximately 5 degrees). In other implementations, combiner 220 and the discrete component reflective narrowband device 240 may be parallel to each other, and one or both of combiner 220 and reflective narrowband device 240 may be configured to deflect light from FP diode 230 at a particular angle (e.g., for reducing coupling of unwanted back-reflections or feedback).

During operation, pump laser 265 may operate in a manner as that described in association with pump laser 260 of FIG. 2C. However, the discrete component reflective narrowband device 240 (e.g., arranged between combiner 220 and lens 225-3) partially reflects the pump light back to FP diode 230 (e.g., in a reverse direction on a portion of the second optical path; via lens 225-3 and lens 225-2) in order to stabilize the wavelength of the pump light sent by FP diode 230.

Figure 2E:
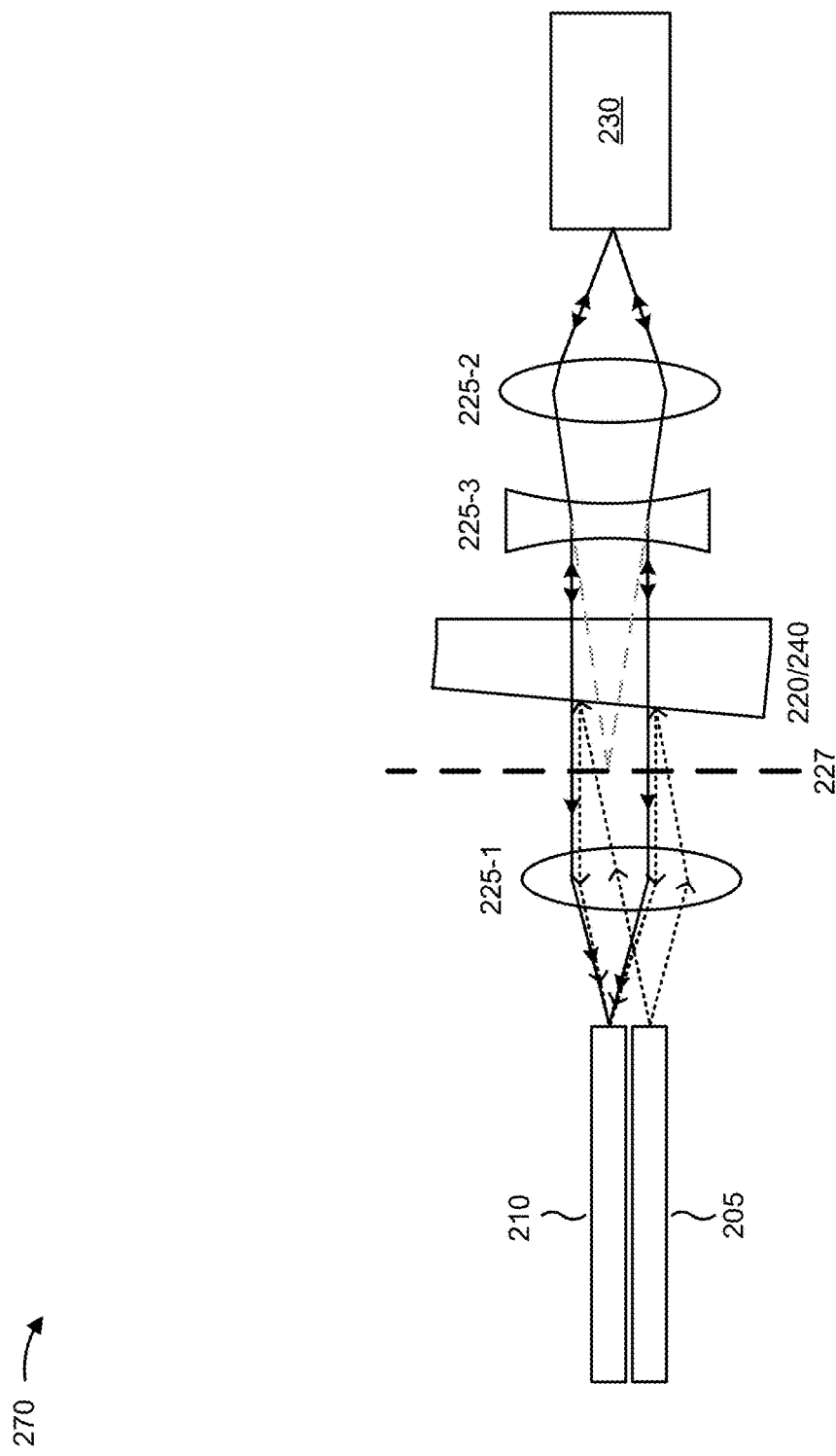

FIG. 2E is a diagram of an example pump laser 270, including a combiner and three lenses in free-space inside a package, that achieves wavelength stabilization of a laser diode and combines a pumping beam and a signal beam, with reduced alignment sensitivity and/or increased manufacturability. As shown in FIG. 2E, pump laser 270 may include input fiber 205, output fiber 210, combiner 220, lens 225-1, lens 225-2, lens 225-3, FP diode 230, and reflective narrowband device 240. Input fiber 205, output fiber 210, lens 225-1, lens 225-2, lens 225-3, and/or FP diode 230 may be arranged and/or may operate in a similar manner as described above.

As described above, reflective narrowband device 240 is a component for partially reflecting the pump light, sent by FP diode 230, in order to stabilize the wavelength of the pump light sent by FP diode 230 in the free-space of the package of pump laser 255. In some implementations, as shown in FIG. 2E, reflective narrowband device 240 may be integrated with combiner 220 (e.g., such that combiner 220 and reflective narrowband device 240 are included in a single component within the free-space of pump laser 270). For example, the integrated combiner 220/reflective narrowband device 240 may be a VHG (Volume Holographic Grating) with a WDM coating, a WDM coating with a low-reflective narrowband coating, or the like. In some implementations, as shown in FIG. 2E, a combiner 220 portion of such an integrated component (e.g., the left portion of component 220/240 in FIG. 2E) and a reflective narrowband device 240 portion of the integrated component (e.g., the right portion of component 220/240 in FIG. 2E) may have different incident angles.

During operation, pump laser 270 may operate in a manner as that described in association with pump laser 260 of FIG. 2D. However, the integrated combiner 220/reflective narrowband device 240 partially reflects the pump light back to FP diode 230 (e.g., in a reverse direction on the second optical path; via lens 225-3 and lens 225-2) in order to stabilize the wavelength of the pump light sent by FP diode 230.

Figure 2F:
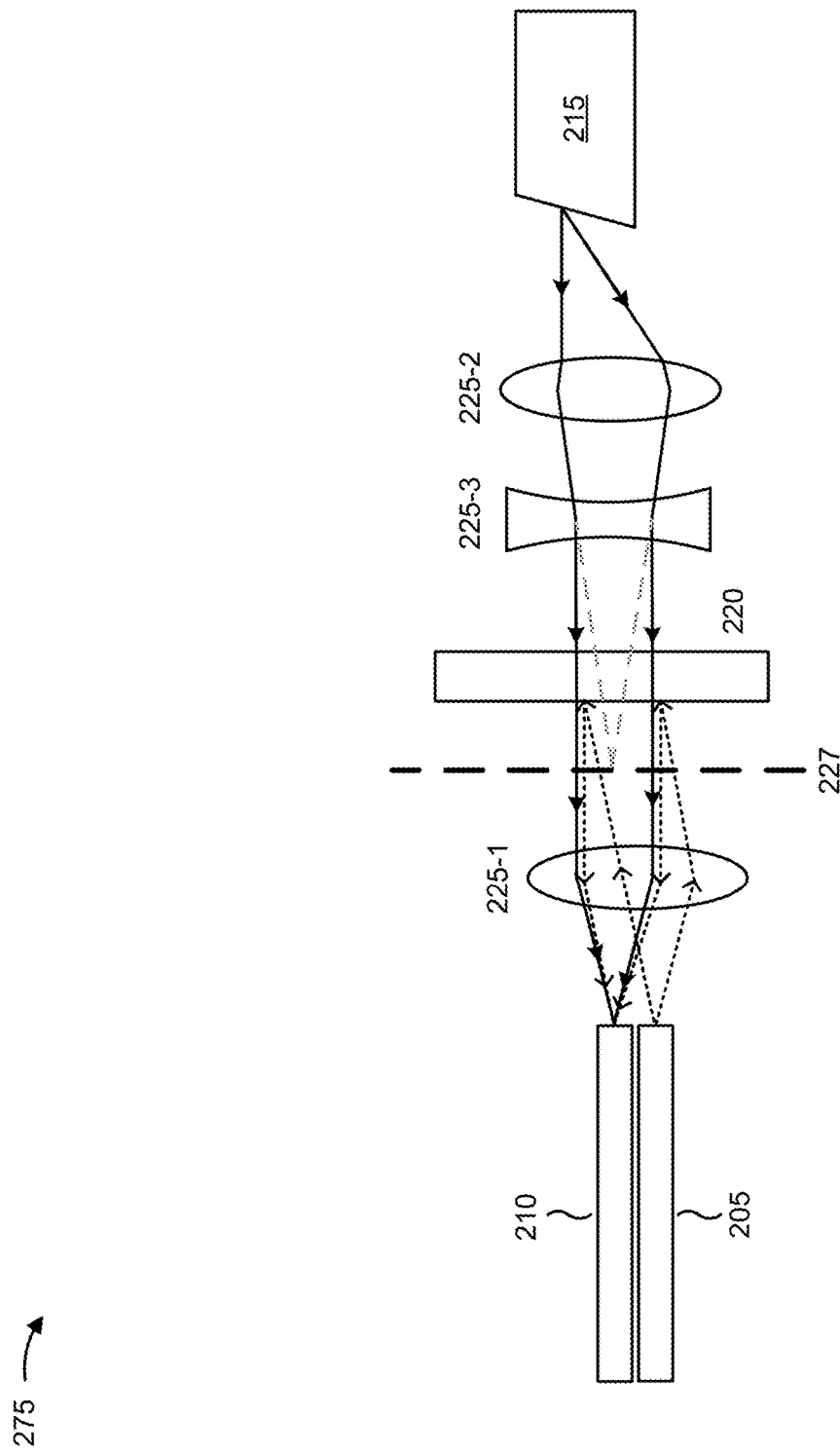
Figure 2G:
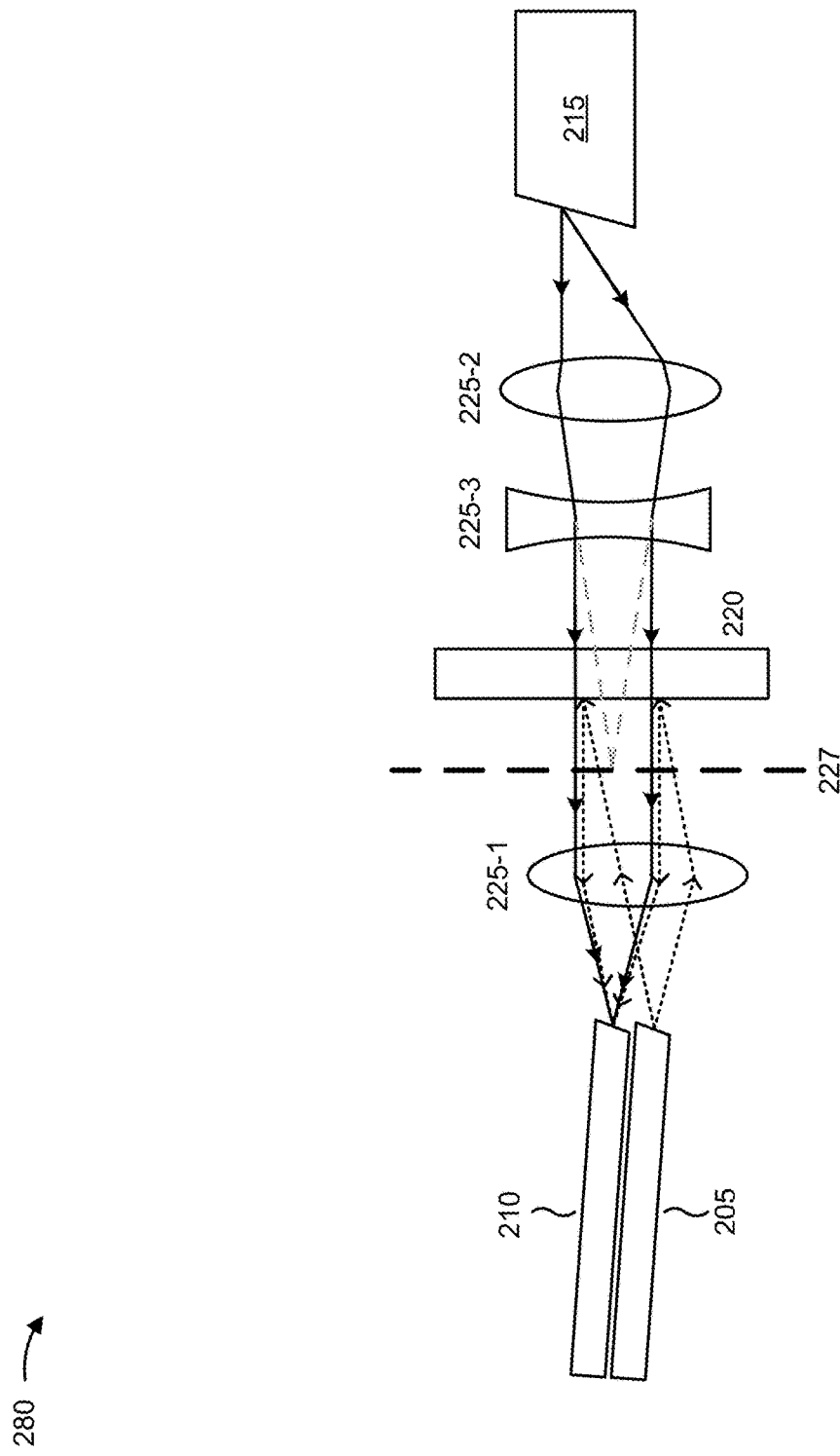

FIGS. 2F and 2G are diagrams of example pump lasers 275 and 280, respectively, that may improve efficacy of wavelength stabilization of the pump light beam with regard to a desired wavelength by using angled facets. The use of angled facets may attenuate broadband feedback from reaching a laser diode (e.g., DFB diode 215 or FP diode 230) that would otherwise compete with feedback intended to stabilize the wavelength of the laser diode. For example, in some implementations, the facet of the laser diode from which the pump light is sent may be an angled waveguide (e.g., as shown in FIGS. 2F and 2G), rather than a straight waveguide (e.g., as in shown in FIGS. 2A-2E). Notably, while pump lasers 275 and 280 are shown as including DFB diode 215 (e.g., as described in connection with FIG. 2A), a similar technique may be used for a pump laser including FP diode 230 (e.g., as described in connection with FIGS. 2B-2E).

As shown in FIG. 2F, in some implementations, DFB diode 215 may include an angled first (e.g., front) facet to reflect light away from the diode in order to improve wavelength stabilization. Here, since a second (e.g., back) facet of DFB diode 215 typically remains at normal incidence to the diode waveguide, the diode waveguide may be bent at a shallow angle (e.g., 2 degrees, 3 degrees, or a larger or smaller angle greater than 0 degrees) to produce an angled front facet.

In some implementations, the angle at which the pump light is emitted from DFB diode 215 is different from that shown in, for example, the example implementation shown in FIG. 2E. For example, a rotation of DFB diode 215, locations of lens 225-1 and lens 225-2, and/or a fiber tail assembly (FTA) of pump laser 275 can be selected to modify the angle at which the pump light is emitted and/or reflected. In this way, pump laser 275 can improve coupling efficiency of the signal light and the pump light with regard to output fiber 210, which improves efficiency of pump laser 275.

Similarly, as shown in FIG. 2G, in some implementations, pump laser 280 may include angled facets at proximal ends of input fiber 205 and output fiber 210. Such an arrangement may reduce an amount of broadband feedback that reaches DFB diode 215 and/or may reduce feedback to input fiber 205 and/or output fiber 210.

In some implementations, input fiber 205 and/or output fiber 210 may be angled to reduce feedback (i.e., reflection) to input fiber 205 and/or output fiber 210 and to DFB diode 215. In some implementations, the angle of the facet of input fiber 205 and/or output fiber 210 may be in a range from approximately 5 degrees to approximately 10 degrees (e.g., approximately 8 degrees). The feedback from the facet of DFB diode 215 and distal ends of input fiber 205 and/or output fiber 210 (e.g., ends opposite from the angled facets) may behave independently. In some implementations, antireflective (AR) coatings with low reflectivity may be used, rather than, or in addition to, angled facets, for reducing feedback.

Figure 2H:
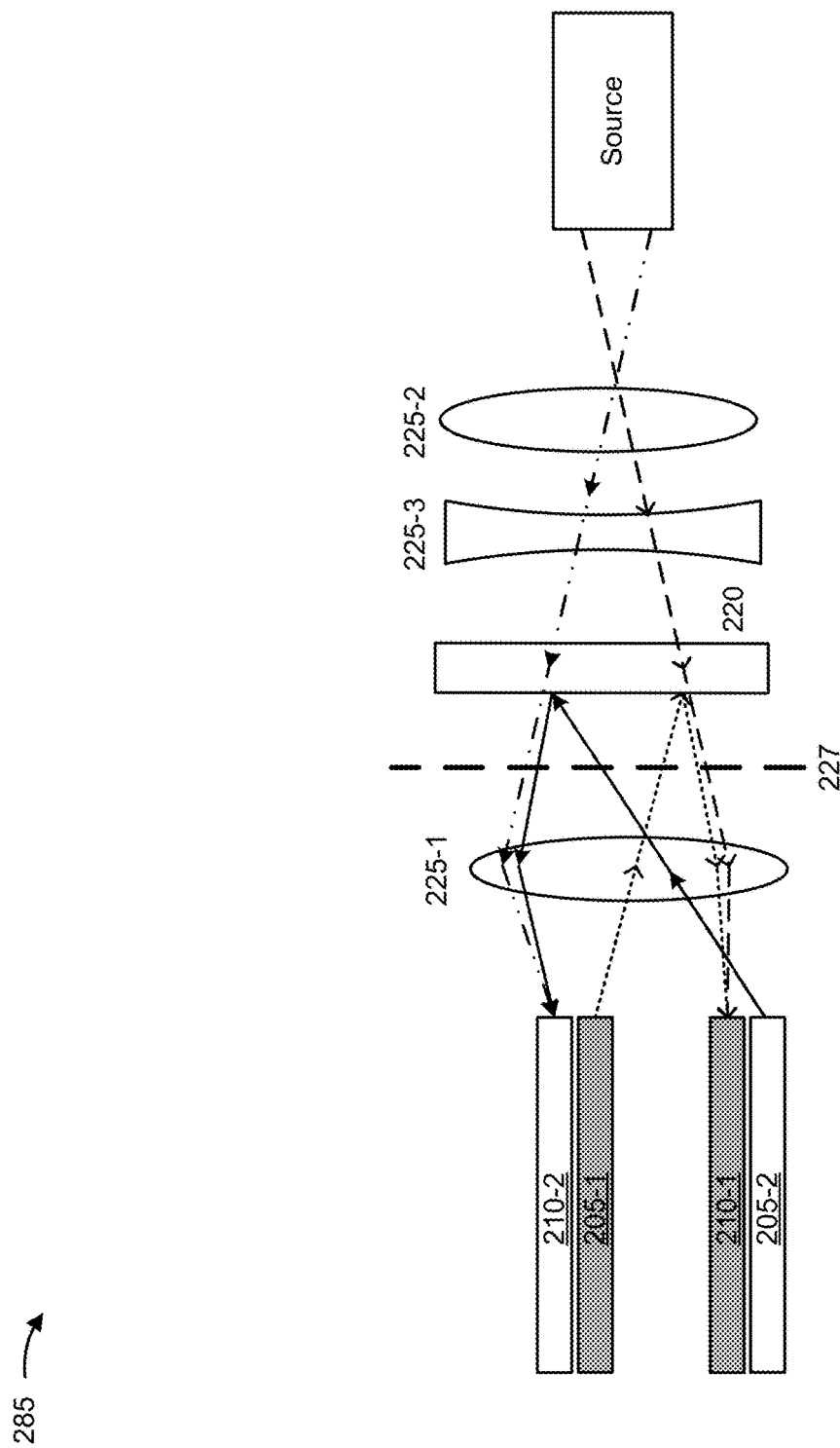

FIG. 2H is a diagram of an example pump laser 285, including a combiner and three lenses in free-space inside a package, that achieves wavelength stabilization of a laser diode, combines a first pumping beam and a first signal beam, and combines a second pumping beam and a second signal beam, with reduced alignment sensitivity and/or increased manufacturability. As shown in FIG. 2H, pump laser 285 may include a first input fiber (e.g., input fiber 205-1), a second input fiber 205 (e.g., input fiber 205-2), a first output fiber 210 (e.g., output fiber 210-1), a second output fiber 210 (e.g., output fiber 210-2), a source (e.g., including a chip with two emission points capable of emitting two beams of pump light, two DFB diodes 215, two FP diodes 230 or the like), combiner 220, lens 225-1, lens 225-2, and lens 225-3. In the example implementation shown in FIG. 2H, the arrows represent center rays of respective optical beams.

Input fibers 205-1 and 205-2, output fibers 210-1 and 210-2, combiner 220, lens 225-1, lens 225-2, and lens 225-3 may be arranged and/or may operate in a similar manner as described above.

During operation, input fiber 205-1 sends first signal light (e.g., a first beam of 1550 nm signal light) on a first optical path from the facet of input fiber 205-1 to combiner 220 (e.g., via lens 225-1) and DFB diode 215 sends first pump light (e.g., a first beam of 980 nm light) on a second optical path from the facet of DFB diode 215 to combiner 220 (e.g., via lens 225-2 and lens 225-3). Combiner 220 reflects the first signal light, received on the first optical path, onto a third optical path (e.g., from combiner 220, via lens 225-1, to a facet of output fiber 210-1), while simultaneously transmitting the first pump light, received on the second optical path, onto the third optical path. Here, by sending the first signal light and the first pump light on the third optical path, combiner 220 causes the first signal light and the first pump light to be combined (i.e., to form first signal+pump light) at the facet of output fiber 210-1. Output fiber 210-1 then outputs the first signal+pump light.

Similarly, input fiber 205-2 sends second signal light (e.g., a second beam of 1550 nm signal light) on a fourth optical path from the facet of input fiber 205-2 to combiner 220 (e.g., via lens 225-1) and DFB diode 215 sends second pump light (e.g., a second beam of 980 nm light) on a fifth optical path from the facet of DFB diode 215 to combiner 220 (e.g., via lens 225-2 and lens 225-3). Combiner 220 reflects the second signal light, received on the fourth optical path, onto a sixth optical path (e.g., from combiner 220, via lens 225-1, to a facet of output fiber 210-2), while simultaneously transmitting the second pump light, received on the fifth optical path, onto the sixth optical path. Here, by sending the second signal light and the second pump light on the sixth optical path, combiner 220 causes the second signal light and the second pump light to be combined (i.e., to form second signal+pump light) at the facet of output fiber 210-2. Output fiber 210-2 then outputs the second signal+pump light. In some implementations, pump laser 285 may include a different number of pairs of input fibers 205 and output fibers 210 (e.g., three or more pairs of input fibers 205 and output fibers 210) than shown in FIG. 2H.

As shown in FIG. 2H, lens 225-1, lens 225-2, lens 225-3, and/or combiner 220 may not need to be duplicated in order to increase the number of fiber-pairs being managed (e.g., where two fiber pairs are managed in pump laser 285). However, in some implementations, a size of lens 225-1, lens 225-2, lens 225-3, and/or combiner 220 may need to be increased based at least in part on an arrangement and/or a number of fiber pairs. Additionally, the source (e.g., the chip with two emission points) should be scale such that a sufficient number of emission points of source light (each corresponding to a fiber pair) are provided. In some implementations, each of the multiple fiber-pairs and optical paths may share the same virtual image plane 227 and/or welding joint plane by virtue of using the same free-space optics of pump laser 285.

Although FIG. 2H arranges the lenses 225-1 through 225-3 and combiner 220 in a manner similar to FIG. 2A while having multiple input fibers 205-1 and 205-2 and multiple output fibers 210-1 and 210-2, some implementations of FIGS. 2B through 2E may include multiple input fibers and multiple output fibers in a manner similar to FIG. 2H. Similarly, some implementations of combinations of FIGS. 2A-2E with FIG. 2H may also include the angled facets of FIGS. 2F and 2G.

The number and arrangement of elements shown in FIGS. 2A-2H are provided as examples. In practice, pump lasers 250, 255, 260, 265, 270, 275, and 285 may include additional elements, fewer elements, different elements, differently formed elements, differently designed elements, or differently arranged elements than those shown in FIGS. 2A-2H. For example, implementations containing two or more laser diodes are possible (e.g., where each laser diode emits one or more beams of pump light to be combined with one or more corresponding signal beams, as described above with regard to FIG. 2H). Additionally, or alternatively, a set of elements (e.g., one or more elements) of pump lasers 250, 255, 260, 265, 270, 275, and 285 may perform one or more functions described as being performed by another set of elements of the pump lasers 250, 255, 260, 265, 270, 275, and 285.

As another example, while pump lasers 250, 255, 260, 265, 270, 275, and 285 are described and shown as including input fiber 205 and output fiber 210 being arranged with respect to a first side of combiner 220, and a source (e.g., DFB diode 215, FP diode 230, or the like) being arranged with respect to a second (opposite) side of combiner 220, other arrangements are possible. As a particular example, in some implementations, input fiber 205 may be arranged with respect to a first side of combiner 220, and the source and output fiber 210 may be arranged with respect to a second side of combiner 220. In such a case, combiner 220 may be configured to receive the signal light on the first optical path and send (e.g., transmit) the signal light on the third optical path, and to receive the pump light on the second optical path and send (e.g., reflect) the pump light on the third optical path.

Figure 4A:
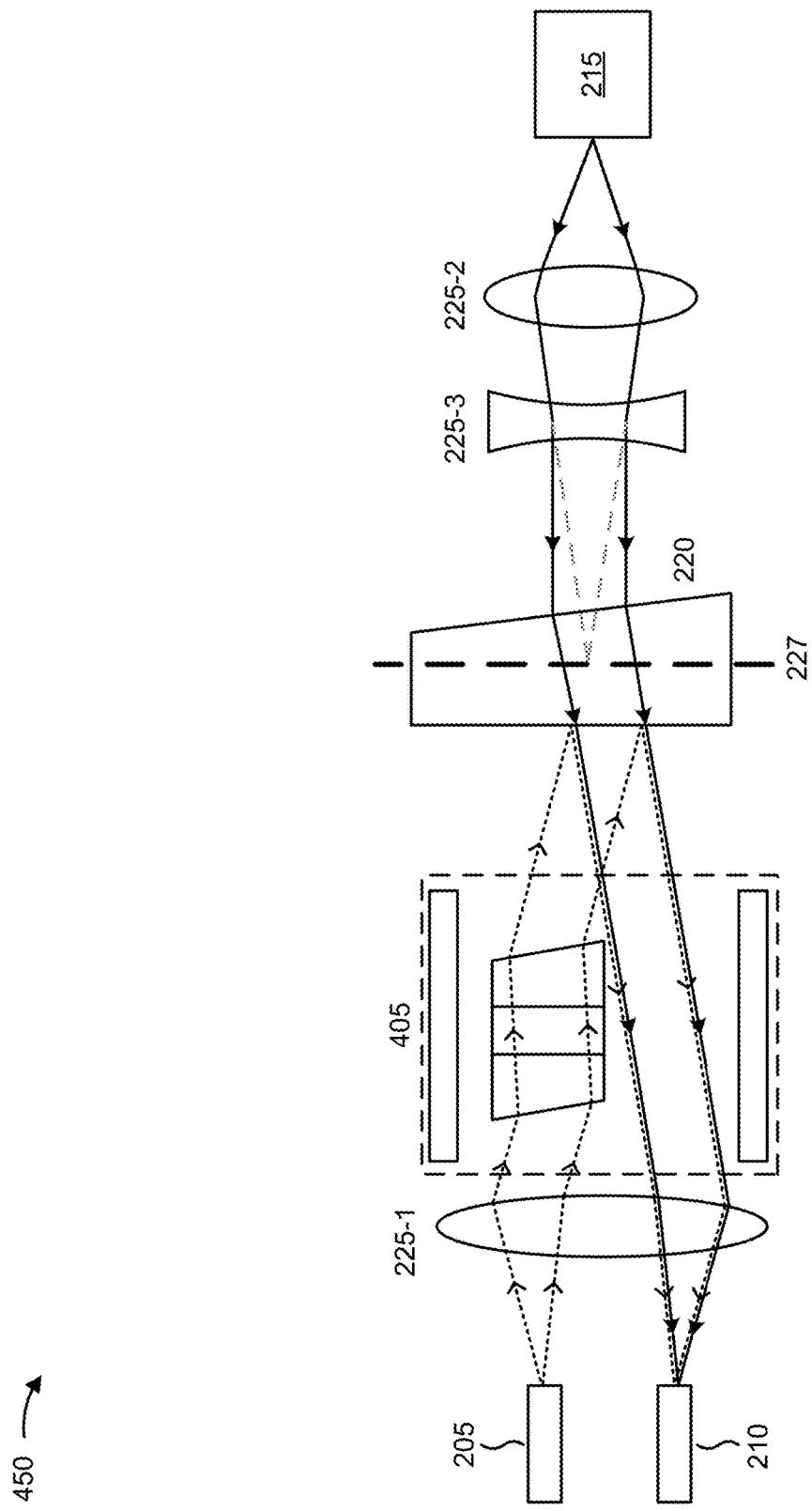
FIGS. 4A-4C are diagrams of example implementations of fiber coupled laser source pumps that include WDMs and isolators in free-space inside a package.
Figure 4B:
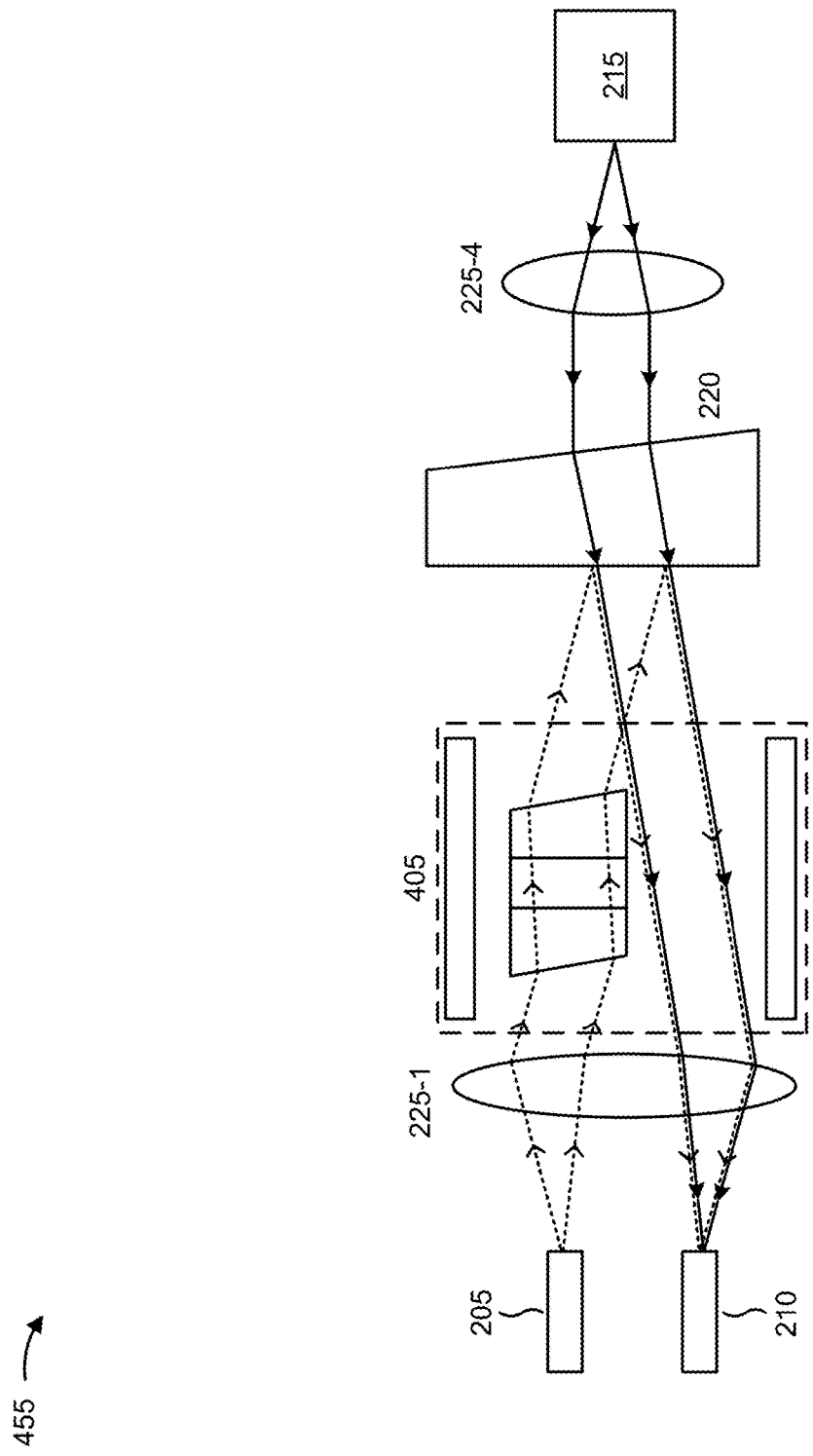
Figure 4C:
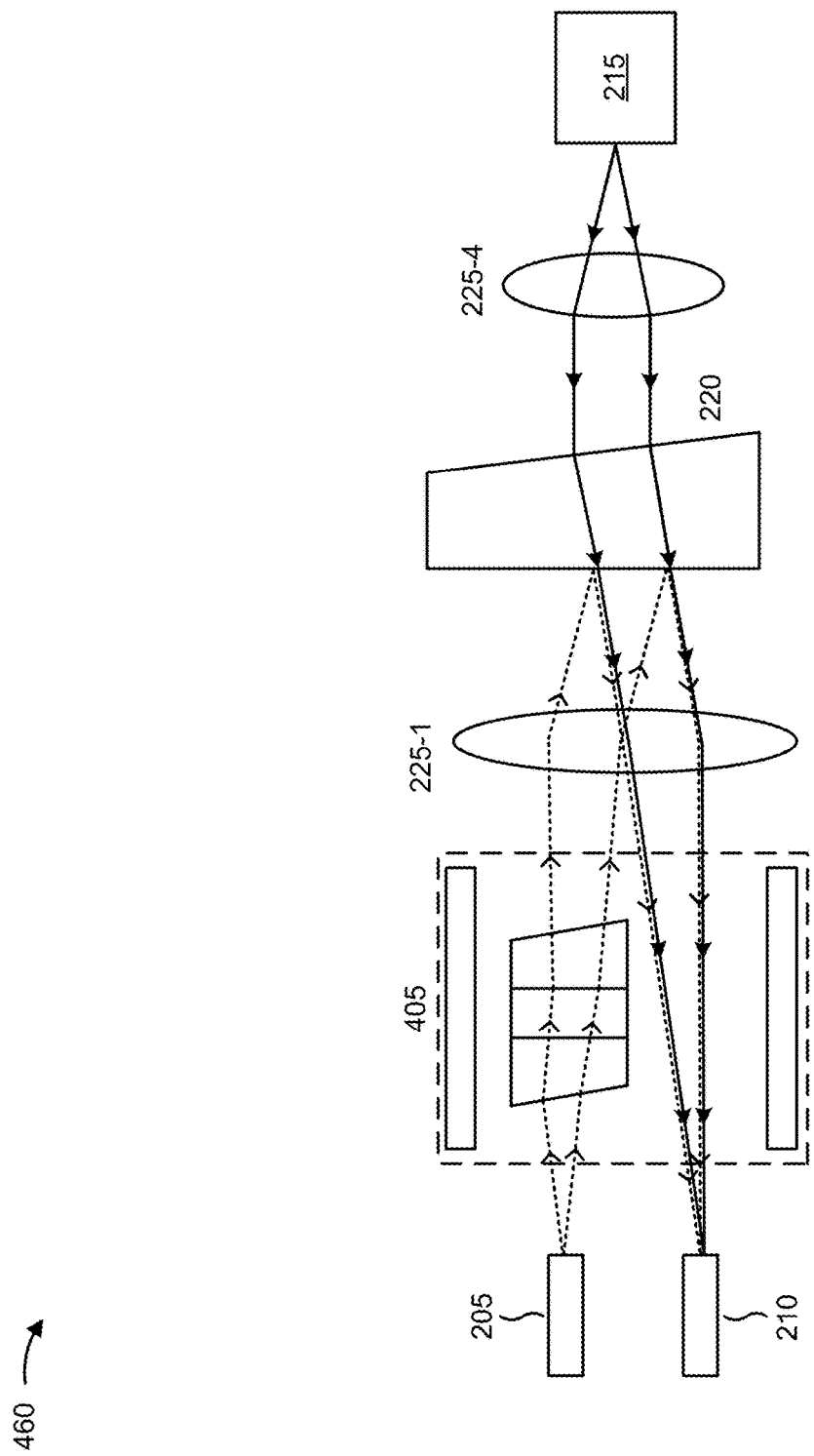

FIGS. 4A-4C are diagrams of example implementations of fiber coupled laser source pumps that include WDMs and isolators in free-space inside a package. Pump lasers 450, 455, and 460 achieve wavelength stabilization of a laser diode and combine a pumping beam and a signal beam into a combined output beam, while providing for isolation of signal light, as described herein. In some implementations, pump lasers 450, 455, and 460 may be housed in pump laser package 100. In the example implementations shown in FIGS. 4A-4C, the arrows represent approximate edge rays of respective optical beams.

FIG. 4A is a diagram of an example pump laser 450, including a combiner, an isolator, and three lenses in free-space inside a package. As shown in FIG. 4A, pump laser 450 may include input fiber 205, output fiber 210, DFB diode 215, combiner 220, lens 225-1, lens 225-2, lens 225-3, and an isolator 405. In some implementations, a photo-diode (PD) may be integrated at back-side of DFB diode 215 in order to monitor an output power of DFB diode 215 (not shown). Input fiber 205, output fiber 210, DFB diode 215, combiner 220, lens 225-1, lens 225-2, and lens 225-3 may be arranged and/or may operate in a similar manner as described above.

Isolator 405 is an element that prevents (i.e., blocks) a beam of light from propagating in an unwanted direction along an optical path. For example, isolator 405 may be arranged to prevent or block reflected signal light (e.g., a portion of the signal light travelling in the reverse direction on the first optical path from combiner 220 toward input fiber 205) from being launched into input fiber 205. In some implementations, isolator 405 may include a rotator element (e.g., a polarization-independent Faraday rotator) arranged between a pair of wedges (e.g., a pair of birefringent wedges). In some implementations, isolator 405 may include a magnet ring that surrounds the rotator element and wedge arrangement (e.g., shown in FIG. 4A in cross-section as a pair of rectangles above and below the rotator element and wedge arrangement). As shown in FIG. 4A, isolator 405 may be arranged on the first optical path between lens 225-1 and combiner 220, in some implementations. In some implementations, input fiber 205 may be a thermal expanded core (TEC) fiber that reduces a collimated beam size in order to ease arrangement of isolator 405 on the first optical path. In some implementations, a gap between input fiber 205 and output fiber 210 may be greater than or equal to approximately 200 microns in order to ease arrangement of isolator 405.

During operation, input fiber 205 sends the signal light (e.g., 1550 nm light) on the first optical path from the facet of input fiber 205 to combiner 220 (e.g., via lens 225-1 and the rotator element and wedge arrangement of isolator 405), and DFB diode 215 sends the pump light (e.g., 980 nm light) on the second optical path from the facet of DFB diode 215 to combiner 220 (e.g., via lens 225-2 and lens 225-3). Combiner 220 reflects the signal light, received on the first optical path, onto the third optical path (e.g., from combiner 220, via free-space of isolator 405 and lens 225-1, to the facet of output fiber 210), while simultaneously transmitting the pump light, received on the second optical path, onto the third optical path. Here, by sending the signal light and the pump light on the third optical path, combiner 220 causes the signal light and the pump light to be combined (i.e., to form the signal+pump light) at the facet of output fiber 210. Output fiber 210 then outputs the signal+pump light. Additionally, isolator 405 prevents reflected signal light, travelling in the reverse direction on the first optical path (e.g., from combiner 220 toward input fiber 205), from being launched into input fiber 205.

As shown in FIG. 4A, in some implementations, pump laser 450 may include lenses 225-2 and 225-3 in order to reduce alignment sensitivity of pump laser 450 and/or increase manufacturability of pump laser 450, as described above.

FIG. 4B is a diagram of an example pump laser 455, including a combiner, an isolator, and two lenses in free-space inside a package. As shown in FIG. 4B, pump laser 455 may include input fiber 205, output fiber 210, DFB diode 215, combiner 220, lens 225-1, a lens 225-4 (e.g., rather than separate lenses 225-2 and 225-3), and isolator 405. In some implementations, a PD may be integrated at back-side of DFB diode 215 in order to monitor an output power of DFB diode 215 (not shown). Input fiber 205, output fiber 210, DFB diode 215, combiner 220, lens 225-1, and isolator 405 may be arranged and/or may operate in a similar manner as described above.

Lens 225-4 includes a lens for collimating a beam of light within the free-space of the package of pump laser 250. For example, a function of lens 225-4 may include collimating the pump light on the second optical path. In some implementations, lens 225-4 may include a lens and lens cap with a short focal length (i.e., strong optical power) in order to allow a package size of pump laser 455 to be reduced (e.g., as compared to pump laser 450 including lenses 225-2 and 225-3).

During operation, input fiber 205 sends the signal light (e.g., 1550 nm light) on the first optical path from the facet of input fiber 205 to combiner 220 (e.g., via lens 225-1 and the rotator element and wedge arrangement of isolator 405), and DFB diode 215 sends the pump light (e.g., 980 nm light) on the second optical path from the facet of DFB diode 215 to combiner 220 (e.g., via lens 225-4). Combiner 220 reflects the signal light, received on the first optical path, onto the third optical path (e.g., from combiner 220, via free-space of isolator 405 and lens 225-1, to the facet of output fiber 210), while simultaneously transmitting the pump light, received on the second optical path, onto the third optical path. Here, by sending the signal light and the pump light on the third optical path, combiner 220 causes the signal light and the pump light to be combined (i.e., to form the signal+pump light) at the facet of output fiber 210. Output fiber 210 then outputs the signal+pump light. Additionally, isolator 405 prevents reflected signal light, travelling in the reverse direction on the first optical path (e.g., from combiner 220 toward input fiber 205), from being launched into input fiber 205.

FIG. 4C is a diagram of an example pump laser 460, including a combiner, an isolator, and two lenses in free-space inside a package. As shown in FIG. 4C, pump laser 460 may include input fiber 205, output fiber 210, DFB diode 215, combiner 220, lens 225-1, lens 225-4, and isolator 405. In some implementations, a PD may be integrated at back-side of DFB diode 215 in order to monitor an output power of DFB diode 215 (not shown). Input fiber 205, output fiber 210, DFB diode 215, combiner 220, and lens 225-4, may be arranged and/or may operate in a similar manner as described above. As shown in FIG. 4C, in pump laser 460, isolator 405 may be arranged on the first optical path between input fiber 205 and lens 225-1 (e.g., rather than being arranged between lens 225-1 and combiner 220, as described above with regard to FIG. 4A). In some implementations, arranging isolator 405 between input fiber 205 and lens 225-1 may reduce a package size of pump laser 460 (e.g., as compared to a package size of pump laser 455).

During operation, input fiber 205 sends the signal light (e.g., 1550 nm light) on the first optical path from the facet of input fiber 205 to combiner 220 (e.g., via the rotator element and wedge arrangement of isolator 405 and lens 225-1), and DFB diode 215 sends the pump light (e.g., 980 nm light) on the second optical path from the facet of DFB diode 215 to combiner 220 (e.g., via lens 225-4). Combiner 220 reflects the signal light, received on the first optical path, onto the third optical path (e.g., from combiner 220, via lens 225-1 and free-space of isolator 405, to the facet of output fiber 210), while simultaneously transmitting the pump light, received on the second optical path, onto the third optical path. Here, by sending the signal light and the pump light on the third optical path, combiner 220 causes the signal light and the pump light to be combined (i.e., to form the signal+pump light) at the facet of output fiber 210. Output fiber 210 then outputs the signal+pump light. Additionally, isolator 405 prevents reflected signal light, travelling in the reverse direction on the first optical path (e.g., from combiner 220 toward input fiber 205), from being launched into input fiber 205.

The number and arrangement of elements shown in FIGS. 4A-4C are provided as examples. In practice, pump lasers 450, 455, and 460 may include additional elements, fewer elements, different elements, differently formed elements, differently designed elements, or differently arranged elements than those shown in FIGS. 4A-4C. For example, while pump lasers 450, 455, and 460 are shown as including DFB diode 215, in some implementations, pump lasers 450, 455, and 460 may include FP diode 230 and FBG 235, FP diode 230 and reflective narrowband device 240 (e.g., implemented as a reflective coating, as discrete element, integrated with combiner 220, and/or the like), as described above. Additionally, or alternatively, a set of elements (e.g., one or more elements) of pump lasers 450, 455, and 460 may perform one or more functions described as being performed by another set of elements of the pump lasers 450, 455, and 460.

Further, in some implementations, one or more features shown in FIGS. 4A-4C may be combined with one or more features shown in any of FIGS. 2A-2E, FIG. 2F, FIG. 2G, FIG. 2H, or any combination thereof.

Figure 5:
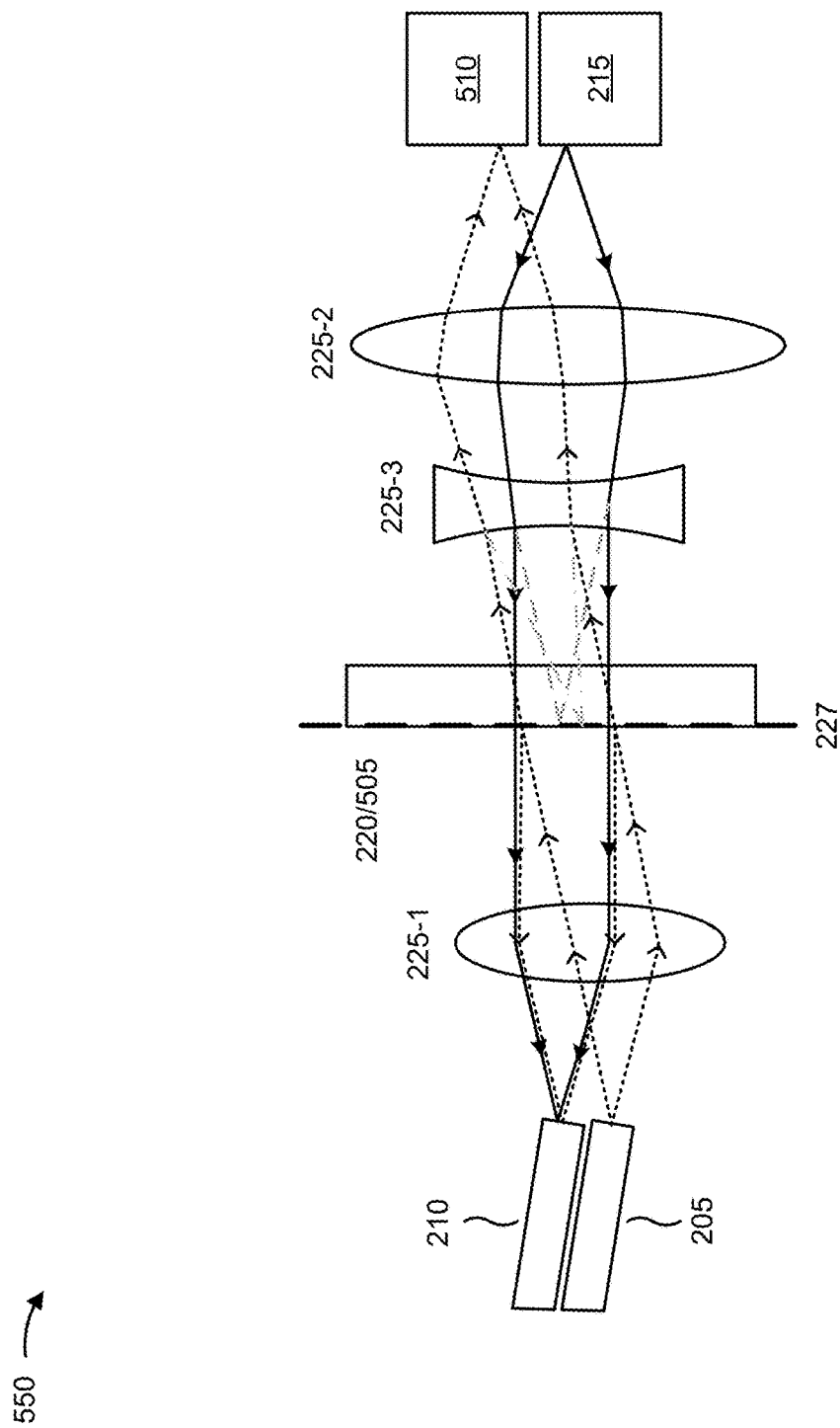
FIG. 5 is a diagram of an example implementation of a fiber coupled laser source pump that includes a WDM, a tap filter, and a photodetector in free-space inside a package.

FIG. 5 is a diagram of an example implementation of a fiber coupled laser source pump that includes a WDM, a tap filter, and a photo-diode (PD) in free-space inside a package. Pump laser 550 achieves wavelength stabilization of a laser diode and combines a pumping beam and a signal beam into a combined output beam, while allowing signal light to be monitored, as described herein. In some implementations, pump laser 550 may be housed in pump laser package 100. In the example implementation shown in FIG. 5, the arrows represent approximate edge rays of respective optical beams.

As shown in FIG. 5, pump laser 550 may include input fiber 205, output fiber 210, DFB diode 215, combiner 220, lens 225-1, lens 225-2, lens 225-3, a tap filter 505, and a PD 510. Input fiber 205, output fiber 210, DFB diode 215, combiner 220, lens 225-1, lens 225-2, and lens 225-3 may be arranged and/or may operate in a similar manner as described above. Notably, while pump laser 550 is shown as including lens 225-2 and lens 225-3 (e.g., in order to reduce alignment sensitivity and/or increased manufacturability), in some implementations, pump laser 550 may include lens 225-4 (e.g., rather than lenses 225-2 and 225-3, in order to reduce a package size of pump laser 550).

Tap filter 505 includes a component for sending a portion of the signal light to PD 510 for monitoring. For example, tap filter 505 may include a component that passes a portion of a beam of light (i.e., partially transmits the signal light) such that the portion of the signal light is sent on a fourth optical path from tap filter 505 to PD 510. In some implementations, tap filter 505 may partially transmit light of a wavelength of approximately 1550 nm (e.g., the signal light) and may partially reflect light of the wavelength of approximately 1550 nm. However, other examples are possible, and tap filter may partially transmit and partially reflect light of one or more other wavelengths.

In some implementations, as shown in FIG. 5, tap filter 505 may be integrated with combiner 220. For example, an integrated combiner 220/tap filter 505 may include a coating on a surface in free-space inside the package that transmits the pump light, partially (e.g., from approximately 0.1% to approximately 20%) transmits the signal light, and partially (e.g., from approximately 80% to approximately 99.9%) reflects the signal light (e.g., rather than transmitting the pump light and reflecting the signal light, as with combiner 220 alone).

As shown in FIG. 5, in some implementations, tap filter 505 may be arranged to receive the signal light sent on the first optical path by input fiber 205, and partially transmit the signal light on a fourth optical path to PD 510 (e.g., via lens 225-2 and lens 225-3). As shown, in some implementations, the fourth optical path may be on a same side of combiner 220 as the second optical path. In some implementations, tap filter 505 may be arranged between lens 225-1 and lens 225-3 (e.g., when integrated with combiner 220).

PD 510 is a component for monitoring a property of the signal light, such as a power of the signal light. For example, PD 510 may include a component that receives a portion of the signal light and converts the portion of the signal light to an electrical signal (e.g., a current) in order to allow the property of the signal light to be determined, identified, and/or monitored based on the electrical signal. As shown in FIG. 5, in some implementations, PD 510 may be arranged to receive the portion of the signal light sent on the fourth optical path by tap filter 505. In some implementations, PD 510 may be arranged adjacent to DFB diode 215. In some implementations, PD 510 may be mounted on a same sub-mount as DFB diode 215. Alternatively, PD 510 and DFB diode 215 may be separately mounted. Including PD 510 within pump laser 550 instead of coupling the fourth optical path to another fiber is advantageous to provide compact signal monitoring, reduce the number of fibers in the pump laser 550 and avoid loss associated with splicing a PD to the another fiber.

During operation, input fiber 205 sends the signal light (e.g., 1550 nm light) on the first optical path from the facet of input fiber 205 to combiner 220/tap filter 505 (e.g., via lens 225-1), and DFB diode 215 sends the pump light (e.g., 980 nm light) on the second optical path from the facet of DFB diode 215 to combiner 220/tap filter 505 (e.g., via lens 225-2 and lens 225-3). Combiner 220/tap filter 505 partially reflects the signal light (e.g., reflects a first portion of the signal light), received on the first optical path, onto the third optical path (e.g., from combiner 220/tap filter 505, via lens 225-1, to the facet of output fiber 210) and partially transmits the signal light (e.g., transmits a second portion of the signal light) onto the fourth optical path (e.g., from combiner 220/tap filter 505, via lens 225-3 and lens 225-2, to PD 510). Combiner 220/tap filter 505 simultaneously transmits the pump light, received on the second optical path, onto the third optical path. Here, by sending the first portion of the signal light and the pump light on the third optical path, combiner 220/tap filter 505 causes the first portion of the signal light and the pump light to be combined (i.e., to form the signal+pump light) at the facet of output fiber 210. Output fiber 210 then outputs the signal+pump light. Additionally, by sending the second portion of the signal light on the fourth optical path, combiner 220/tap filter 505 causes the second portion of the signal light to be received at PD 510.

The number and arrangement of elements shown in FIG. 5 are provided as examples. In practice, pump laser 550 may include additional elements, fewer elements, different elements, differently formed elements, differently designed elements, or differently arranged elements than those shown in FIG. 5. For example, while pump laser 550 is shown as including DFB diode 215, in some implementations, pump lasers 550 may include FP diode 230 and FBG 235, FP diode 230 and reflective narrowband device 240 (e.g., implemented as a reflective coating, as discrete element, integrated with combiner 220, and/or the like), as described above. Additionally, or alternatively, a set of elements (e.g., one or more elements) of pump laser 550 may perform one or more functions described as being performed by another set of elements of the pump laser 550.

Further, in some implementations, one or more features shown in FIG. 5 may be combined with one or more features shown in any of FIGS. 2A-2E, FIG. 2F, FIG. 2G, FIG. 2H, FIGS. 4A-4C, or any combination thereof.

Figure 6A:
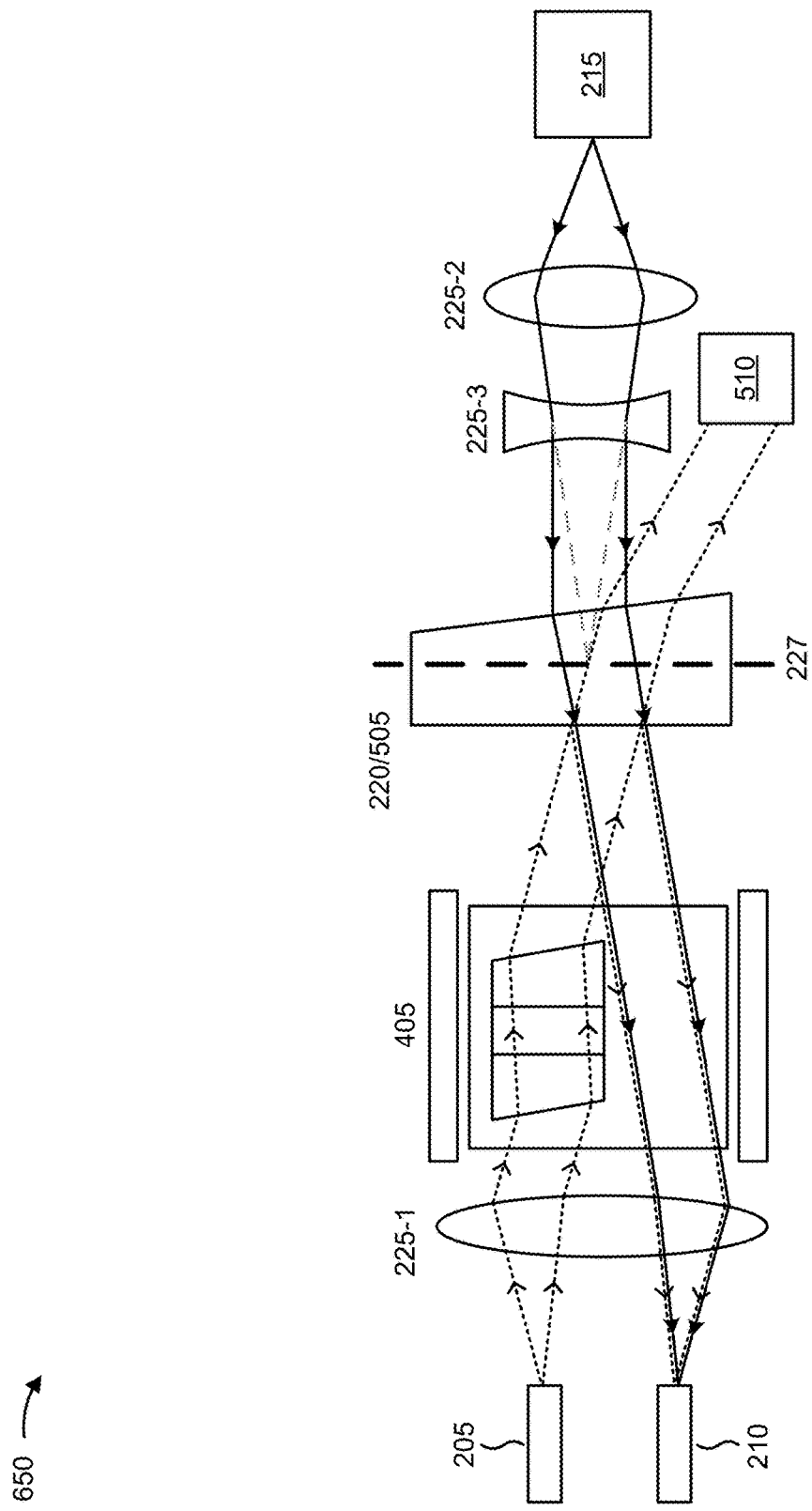
FIGS. 6A-6C are diagrams of example implementations of fiber coupled laser source pumps that include WDMs, isolators, tap filters, and a photodetector in free-space inside a package.
Figure 6B:
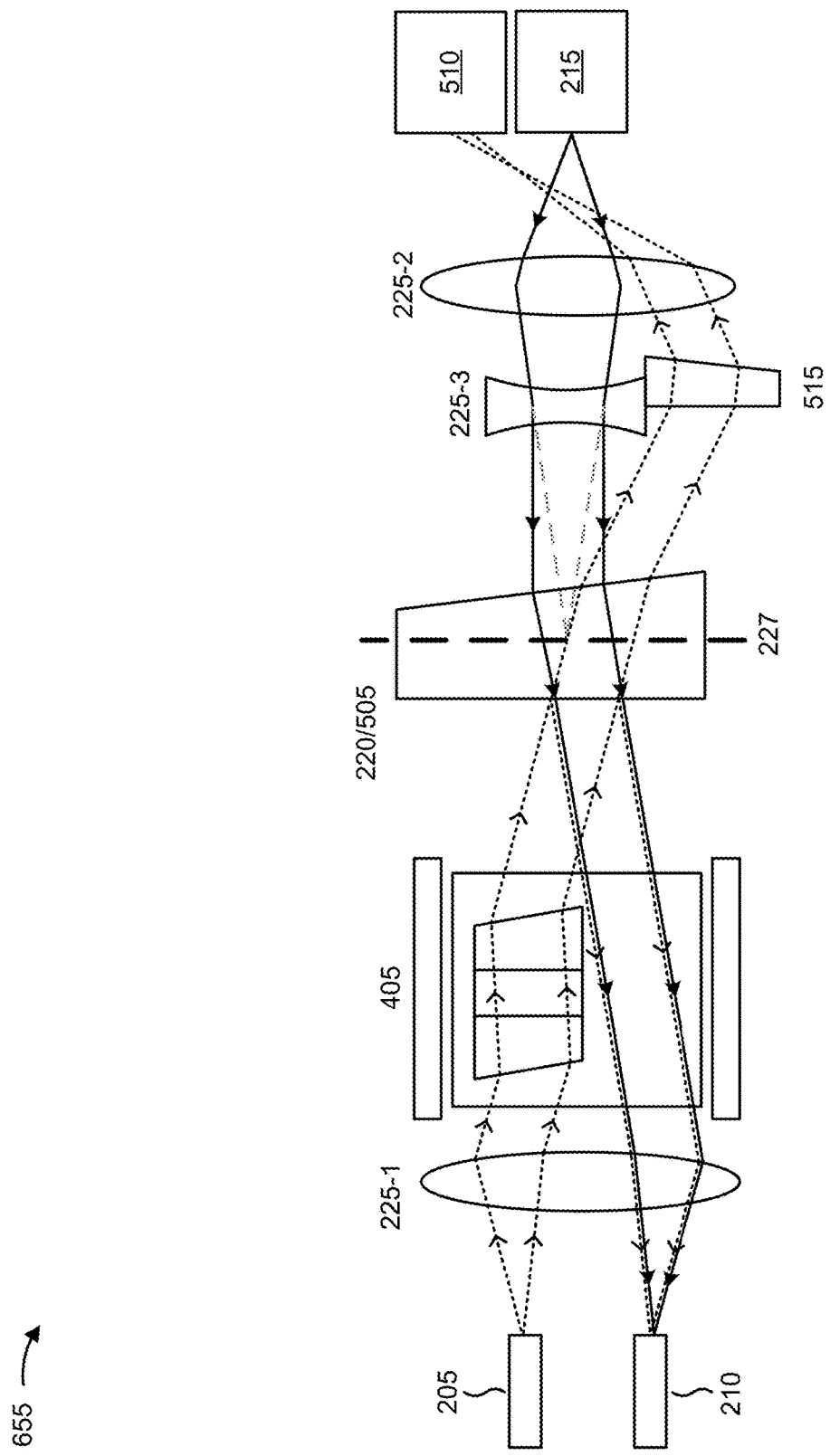
Figure 6C:
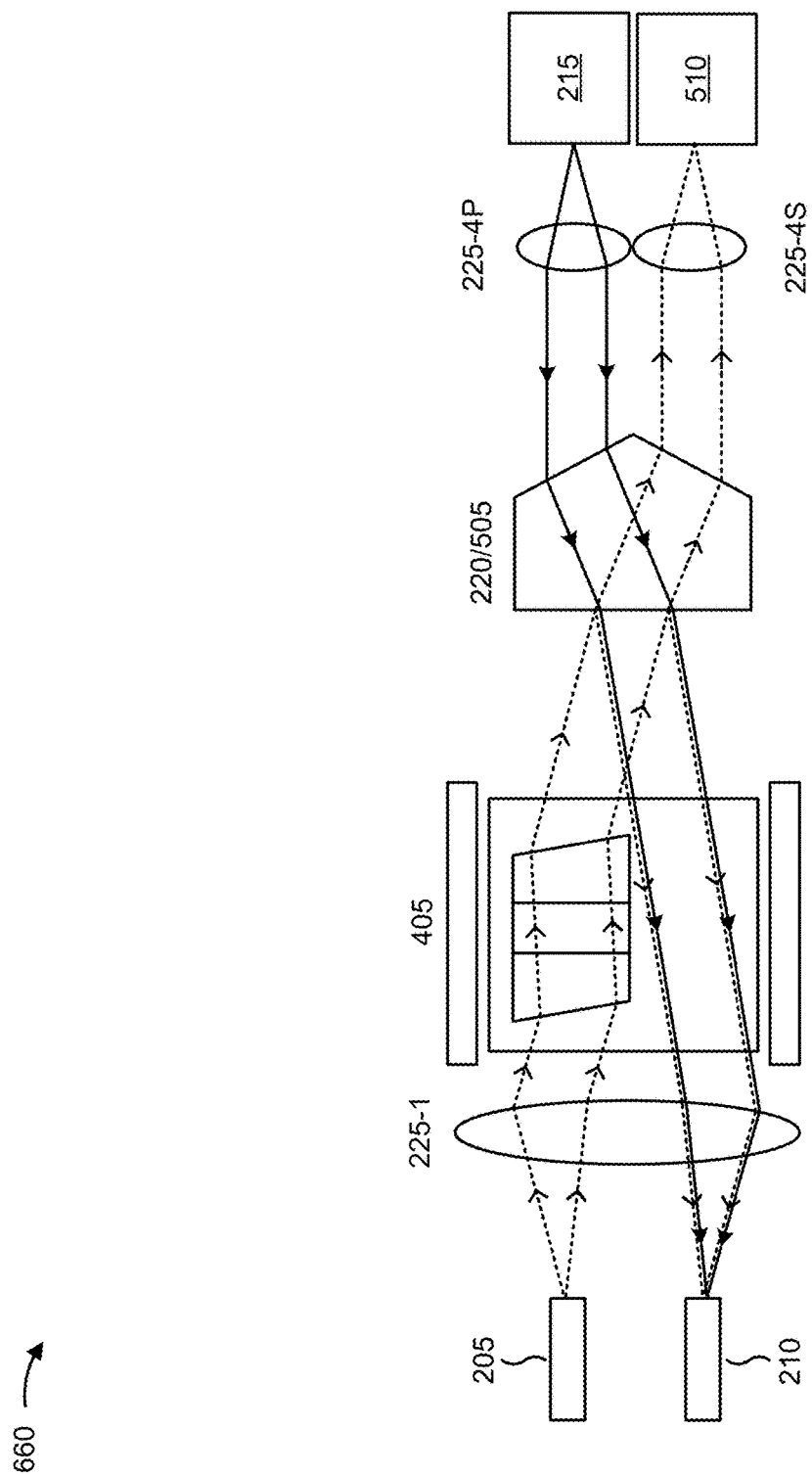

FIGS. 6A-6C are diagrams of example implementations of fiber coupled laser source pumps that include WDMs, isolators, tap filters, and photodetectors in free-space inside a package. Pump lasers 650, 655, and 660 achieve wavelength stabilization of a laser diode and combine a pumping beam and a signal beam into a combined output beam, while providing for isolation and monitoring of signal light, as described herein. In some implementations, pump lasers 650, 655, and 660 may be housed in pump laser package 100. In the example implementations shown in FIGS. 6A-6C, the arrows represent approximate edge rays of respective optical beams.

FIG. 6A is a diagram of an example pump laser 650, including a combiner, an isolator, a tap filter, a PD, and three lenses in free-space inside a package. As shown in FIG. 6A, pump laser 650 may include input fiber 205, output fiber 210, DFB diode 215, combiner 220, lens 225-1, lens 225-2, lens 225-3, isolator 405, tap filter 505, and PD 510. Input fiber 205, output fiber 210, DFB diode 215, combiner 220, lens 225-1, lens 225-2, lens 225-3, isolator 405, tap filter 505, and PD 510 may be arranged and/or may operate in a similar manner as described above. Notably, while pump laser 650 is shown as including lens 225-2 and lens 225-3 (e.g., in order to reduce alignment sensitivity and/or increased manufacturability), in some implementations, pump laser 650 may include lens 225-4 (e.g., rather than lenses 225-2 and 225-3, in order to reduce a package size of pump laser 550).

As shown in FIG. 6A, in some implementations, PD 510 may be arranged such that lens 225-2 and lens 225-3 are not arranged on the fourth optical path. For example, PD 510 may be arranged between combiner 220/tap filter 505 and DFB diode 215 (e.g., rather than being arranged adjacent to DFB diode 215, as described above). In some implementations, arranging PD 510 between combiner 220/tap filter 505 and DFB diode 215 may reduce cross talk from DFB diode 215 (e.g., as compared to an arrangement where PD 510 is arranged adjacent to DFB diode 215).

During operation, input fiber 205 sends the signal light (e.g., 1550 nm light) on the first optical path from the facet of input fiber 205 to combiner 220/tap filter 505 (e.g., via lens 225-1 and the rotator element and wedge arrangement of isolator 405), and DFB diode 215 sends the pump light (e.g., 980 nm light) on the second optical path from the facet of DFB diode 215 to combiner 220/tap filter 505 (e.g., via lens 225-2 and lens 225-3). Combiner 220/tap filter 505 partially reflects the signal light (e.g., reflects a first portion of the signal light), received on the first optical path, onto the third optical path (e.g., from combiner 220/tap filter 505, via free-space of isolator 405 and lens 225-1, to the facet of output fiber 210) and partially transmits the signal light (e.g., transmits a second portion of the signal light) onto the fourth optical path (e.g., from combiner 220/tap filter 505 directly to PD 510). Combiner 220/tap filter 505 simultaneously transmits the pump light, received on the second optical path, onto the third optical path. Here, by sending the first portion of the signal light and the pump light on the third optical path, combiner 220/tap filter 505 causes the first portion of the signal light and the pump light to be combined (i.e., to form the signal+pump light) at the facet of output fiber 210. Output fiber 210 then outputs the signal+pump light. Additionally, by sending the second portion of the signal light on the fourth optical path, combiner 220/tap filter 505 causes the second portion of the signal light to be received at PD 510. Further, isolator 405 prevents reflected signal light, travelling in the reverse direction on the first optical path (e.g., from combiner 220/tap filter 505 toward input fiber 205), from being launched into input fiber 205.

FIG. 6B is a diagram of an example pump laser 655, including a combiner, an isolator, a tap filter, a PD, and three lenses in free-space inside a package. As shown in FIG. 6B, pump laser 655 may include input fiber 205, output fiber 210, DFB diode 215, combiner 220, lens 225-1, lens 225-2, lens 225-3, isolator 405, tap filter 505, PD 510, and a wedge 515. Input fiber 205, output fiber 210, DFB diode 215, combiner 220, lens 225-1, lens 225-2, lens 225-3, isolator 405, tap filter 505, and PD 510 may be arranged and/or may operate in a similar manner as described above. Notably, while pump laser 655 is shown as including lens 225-2 and lens 225-3 (e.g., in order to reduce alignment sensitivity and/or increased manufacturability), in some implementations, pump laser 655 may include lens 225-4 (e.g., rather than lenses 225-2 and 225-3, in order to reduce a package size of pump laser 550).

Wedge 515 is a component, arranged on the fourth optical path in free-space inside the package, for directing a portion of the signal light, sent by tap filter 505 on the fourth optical path, to PD 510 (e.g., via lens 225-2). As shown in FIG. 6B, in some implementations, wedge 515 may be arranged to direct the portion of the signal light, sent on the fourth optical path by combiner 220/tap filter 505, to PD 510, where PD 510 may be arranged adjacent to DFB diode 215 (e.g., mounted on a same sub-mount or separately mounted). Such an arrangement may allow for unidirectional tap monitoring functionality to be realized, therefore only the signal light may be detected by PD 510.

During operation, input fiber 205 sends the signal light (e.g., 1550 nm light) on the first optical path from the facet of input fiber 205 to combiner 220/tap filter 505 (e.g., via lens 225-1 and the rotator element and wedge arrangement of isolator 405), and DFB diode 215 sends the pump light (e.g., 980 nm light) on the second optical path from the facet of DFB diode 215 to combiner 220/tap filter 505 (e.g., via lens 225-2 and lens 225-3). Combiner 220/tap filter 505 partially reflects the signal light (e.g., reflects a first portion of the signal light), received on the first optical path, onto the third optical path (e.g., from combiner 220/tap filter 505, via free-space of isolator 405 and lens 225-1, to the facet of output fiber 210) and partially transmits the signal light (e.g., transmits a second portion of the signal light) onto the fourth optical path (e.g., from combiner 220/tap filter 505, via wedge 515, to PD 510). Combiner 220/tap filter 505 simultaneously transmits the pump light, received on the second optical path, onto the third optical path. Here, by sending the first portion of the signal light and the pump light on the third optical path, combiner 220/tap filter 505 causes the first portion of the signal light and the pump light to be combined (i.e., to form the signal+pump light) at the facet of output fiber 210. Output fiber 210 then outputs the signal+pump light. Additionally, by sending the second portion of the signal light on the fourth optical path, combiner 220/tap filter 505 causes the second portion of the signal light to be received at PD 510. Further, isolator 405 prevents reflected signal light, travelling in the reverse direction on the first optical path (e.g., from combiner 220/tap filter 505 toward input fiber 205), from being launched into input fiber 205.

FIG. 6C is a diagram of an example pump laser 660, including a combiner, an isolator, a tap filter, a PD, and three lenses in free-space inside a package. As shown in FIG. 6C, pump laser 660 may include input fiber 205, output fiber 210, DFB diode 215, combiner 220, lens 225-1, a pair of lenses 225-4 (e.g., identified as lens 225-4P and lens 225-4S), tap filter 505, and PD 510. Input fiber 205, output fiber 210, DFB diode 215, combiner 220, lens 225-1, isolator 405, tap filter 505, and PD 510 may be arranged and/or may operate in a similar manner as described above.

Lens 225-4P is a lens for collimating the pump light sent on the second optical path by DFB diode 215. As shown, lens 225-4P may be arranged in free-space inside the package on the second optical path between DFB diode 215 and combiner 220/tap filter 505.

Lens 225-4S is a lens for focusing a portion of the signal light sent on the fourth optical path by combiner 220/tap filter 505. As shown, lens 225-4S may be arranged in free-space inside the package on the fourth optical path between combiner 220/tap filter 505 and PD 510. In some implementations, use of lens 225-4P and lens 225-4S may allow for a reduced package size of pump laser 660 (e.g., as compared to a package size when using lens 225-2 and lens 225-3, as describe above). Such an arrangement may allow for unidirectional tap monitoring functionality to be realized, therefore only the signal light may be detected by PD 510.

During operation, input fiber 205 sends the signal light (e.g., 1550 nm light) on the first optical path from the facet of input fiber 205 to combiner 220/tap filter 505 (e.g., via lens 225-1 and the rotator element and wedge arrangement of isolator 405), and DFB diode 215 sends the pump light (e.g., 980 nm light) on the second optical path from the facet of DFB diode 215 to combiner 220/tap filter 505 (e.g., via lens 225-4P). Combiner 220/tap filter 505 partially reflects the signal light (e.g., reflects a first portion of the signal light), received on the first optical path, onto the third optical path (e.g., from combiner 220/tap filter 505, via free-space of isolator 405 and lens 225-1, to the facet of output fiber 210) and partially transmits the signal light (e.g., transmits a second portion of the signal light) onto the fourth optical path (e.g., from combiner 220/tap filter 505, via lens 225-4S, to PD 510). Combiner 220/tap filter 505 simultaneously transmits the pump light, received on the second optical path, onto the third optical path. Here, by sending the first portion of the signal light and the pump light on the third optical path, combiner 220/tap filter 505 causes the first portion of the signal light and the pump light to be combined (i.e., to form the signal+pump light) at the facet of output fiber 210. Output fiber 210 then outputs the signal+pump light. Additionally, by sending the second portion of the signal light on the fourth optical path, combiner 220/tap filter 505 causes the second portion of the signal light to be received at PD 510. Further, isolator 405 prevents reflected signal light, travelling in the reverse direction on the first optical path (e.g., from combiner 220/tap filter 505 toward input fiber 205), from being launched into input fiber 205.

The number and arrangement of elements shown in FIGS. 6A-6C are provided as examples. In practice, pump lasers 650, 655, and 660 may include additional elements, fewer elements, different elements, differently formed elements, differently designed elements, or differently arranged elements than those shown in FIGS. 6A-6C. For example, while pump lasers 650, 655, and 660 are shown as including DFB diode 215, in some implementations, pump lasers 650, 655, and 660 may include FP diode 230 and FBG 235, FP diode 230 and reflective narrowband device 240 (e.g., implemented as a reflective coating, as discrete element, integrated with combiner 220, and/or the like), as described above. Additionally, or alternatively, a set of elements (e.g., one or more elements) of pump lasers 650, 655, and 660 may perform one or more functions described as being performed by another set of elements of the pump lasers 650, 655, and 660.

Further, in some implementations, one or more features shown in any of FIGS. 6A-6C may be combined with one or more features shown in any of FIGS. 2A-2E, FIG. 2F, FIG. 2G, FIG. 2H, FIGS. 4A-4C, FIG. 5, or any combination thereof.

Figure 7:
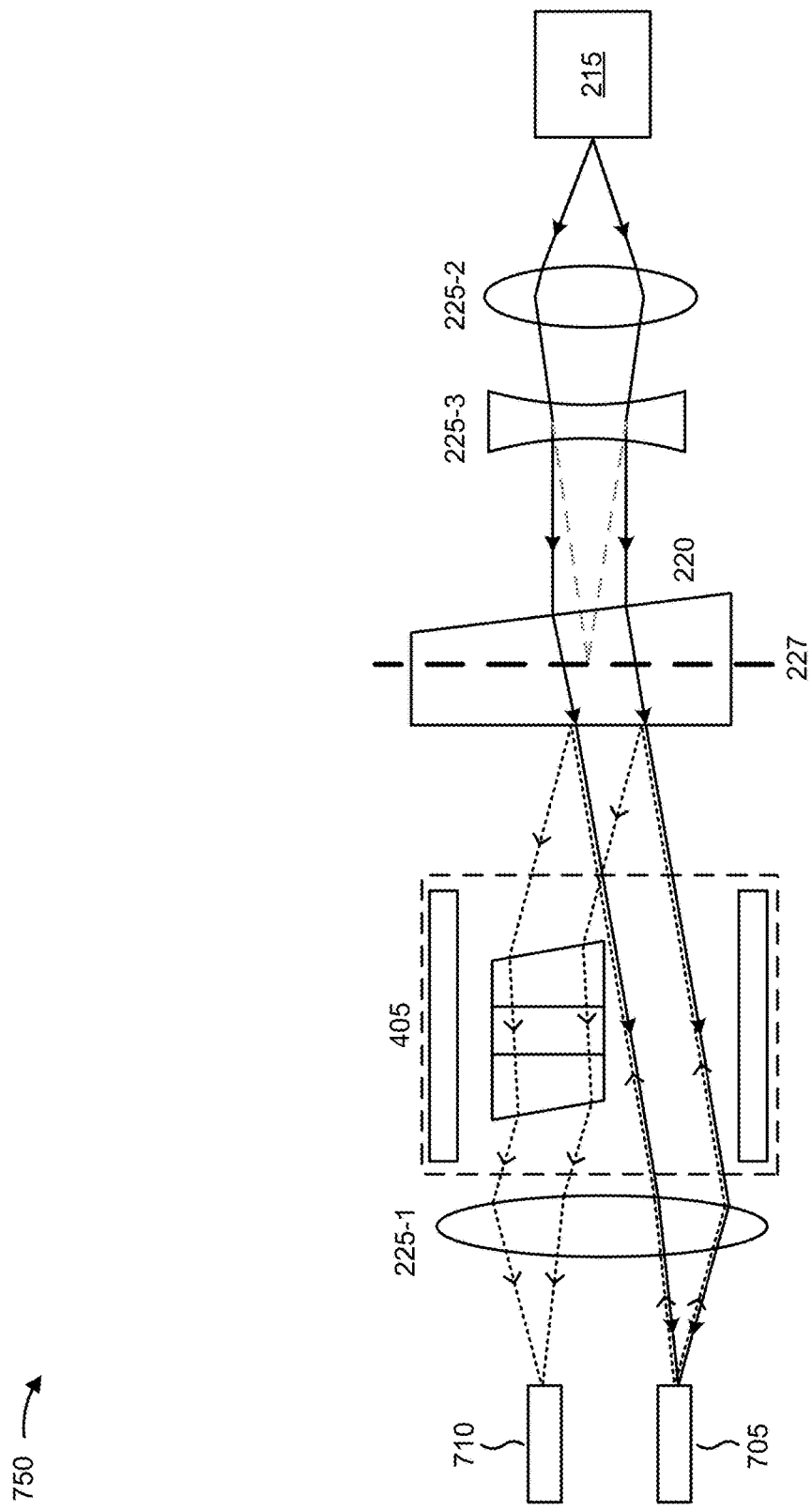
FIG. 7 is a diagram of an example implementation of reverse pumping fiber coupled laser source pump that includes a WDM and an isolator in free-space inside a package.

FIG. 7 is a diagram of an example implementation of reverse pumping fiber coupled laser source pump that includes a WDM and an isolator in free-space inside a package. Pump laser 750 achieves wavelength stabilization of a laser diode in a reverse pumping configuration (e.g., whereby the pump light is output via a same fiber that launches the signal light), while providing for isolation of signal light, as described herein. In some implementations, pump laser 750 may be housed in pump laser package 100. In the example implementation shown in FIG. 7, the arrows represent approximate edge rays of respective optical beams.

FIG. 7 is a diagram of an example pump laser 750, including a combiner, an isolator, and three lenses in free-space inside a package. As shown in FIG. 7, pump laser 750 may include a first fiber 705, a second fiber 710, DFB diode 215, combiner 220, lens 225-1, lens 225-2, lens 225-3, and isolator 405. DFB diode 215, combiner 220, lens 225-1, lens 225-2, lens 225-3, and isolator 405 may be arranged and/or may operate in a similar manner as described above. Notably, while pump laser 750 is shown as including lens 225-2 and lens 225-3 (e.g., in order to reduce alignment sensitivity and/or increased manufacturability), in some implementations, pump laser 750 may include lens 225-4 (e.g., rather than lenses 225-2 and 225-3, in order to reduce a package size of pump laser 750).

First fiber 705 is a fiber sending the signal light in free-space inside a package of pump laser 750, receiving the pump light via the free-space inside the package of pump laser 750, and outputting the pump light. As shown in FIG. 7 (by the dotted lines pointing in the right direction), first fiber 705 may be arranged such that first fiber 205 sends the signal light on the first optical path, via lens 225-1 and free-space of isolator 405, to combiner 220. As shown in FIG. 7 (by the solid lines pointing in the left direction), first fiber 705 may be arranged such that first fiber 205 receives, via the free-space of isolator 405 and lens 225-1, the pump light on the first optical path (i.e., in an opposite direction from a direction of sending the signal light).

Second fiber 710 is a fiber for receiving signal light via the free-space inside the package of pump laser 750 and outputting the signal light. As shown in FIG. 7 (by the dotted lines pointing in the left direction), second fiber 710 may be arranged such that second fiber 710 receives via the rotator element and wedge arrangement of isolator 405 and lens 225-1 the signal light on the third optical path. In this way, first fiber 705 and second fiber 710 may be arranged such that pump laser 750 operates in a reverse pumping configuration.

During operation, first fiber 705 sends the signal light (e.g., 1550 nm light) on the first optical path from the facet of first fiber 705 to combiner 220 (e.g., via lens 225-1 and the free-space of isolator 405), and DFB diode 215 sends the pump light (e.g., 980 nm light) on the second optical path from the facet of DFB diode 215 to combiner 220 (e.g., via lens 225-2 and lens 225-3). Combiner 220 reflects the signal light, received on the first optical path, onto the third optical path (e.g., from combiner 220, via the rotator element and wedge arrangement of isolator 405 and lens 225-1, to the facet of second fiber 710), while simultaneously transmitting the pump light, received on the second optical path, onto the first optical path (e.g., in a direction from combiner 220 toward first fiber 705). Here, by sending the signal light on the third optical path, combiner 220 causes the signal light to be incident on the facet of second fiber 710. Second fiber 710 then outputs the signal light. Additionally, isolator 405 prevents reflected signal light, travelling in the reverse direction on the third optical path (e.g., from the fact of second fiber 710 toward combiner 220), from reaching combiner 220. Further, by sending the pump light on the first optical path, combiner 220 causes the pump light to be incident on the facet of first fiber 705, thereby providing reverse pumping functionality.

The number and arrangement of elements shown in FIG. 7 are provided as examples. In practice, pump laser 750 may include additional elements, fewer elements, different elements, differently formed elements, differently designed elements, or differently arranged elements than those shown in FIG. 7. For example, while pump laser 750 is shown as including DFB diode 215, in some implementations, pump lasers 750 may include FP diode 230 and FBG 235, FP diode 230 and reflective narrowband device 240 (e.g., implemented as a reflective coating, as discrete element, integrated with combiner 220, and/or the like), as described above. As another example, pump laser 750 may include tap filter 505 and PD 510, as described above. Additionally, or alternatively, a set of elements (e.g., one or more elements) of pump laser 750 may perform one or more functions described as being performed by another set of elements of the pump laser 750.

Further, in some implementations, one or more features shown in FIG. 7 may be combined with one or more features shown in any of FIGS. 2A-2E, FIG. 2F, FIG. 2G, FIG. 2H, FIGS. 4A-4C, FIG. 5, FIGS. 6A-6C, or any combination thereof.

Implementations described herein provide a pump laser that provides a signal and a pumping beam as a combined optical signal while performing one or more additional optical functions. Advantages of the implementations described herein may include reducing use of physical space by the optical amplifier system, reducing a number of fibers in the optical amplifier system, reducing a number of fiber splices of the optical amplifier system, reducing size of optical components of the optical amplifier system, simplifying configuration and/or construction of the optical amplifier system, and/or reducing cost of implementing the optical amplifier system (e.g., as compared to a prior optical amplifier system that includes discrete components).

The foregoing disclosure provides illustration and description, but is not intended to be exhaustive or to limit the implementations to the precise form disclosed. Modifications and variations are possible in light of the above disclosure or may be acquired from practice of the implementations. For example, while pump lasers described herein are described and shown as including input fiber 205 and output fiber 210 being arranged with respect to a first side of combiner 220, and a source (e.g., DFB diode 215, FP diode 230, or the like) being arranged with respect to a second (opposite) side of combiner 220, other arrangements are possible. As a particular example, in some implementations, input fiber 205 may be arranged with respect to a first side of combiner 220, and the source and output fiber 210 may be arranged with respect to a second side of combiner 220. In such a case, combiner 220 may be configured to receive the signal light on the first optical path and send (e.g., transmit) the signal light on the third optical path, and to receive the pump light on the second optical path and send (e.g., reflect) the pump light on the third optical path.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A pump laser package, comprising:
   an input fiber to send signal light on a first optical path in free-space inside a package;
   a source to send pump light on a second optical path in free-space inside the package;
   an output fiber on a third optical path in free-space inside the package;
   a wavelength division multiplexing (WDM) filter inside the package to:
   receive the signal light on the first optical path and send the signal light on the third optical path, and
   receive the pump light on the second optical path and send the pump light on the third optical path;
   an isolator inside the package to:
   transmit the signal light in a first direction on the first optical path, and
   block the signal light in a second direction on the first optical path;
   a first lens arranged on the first optical path and the third optical path; and
   a second lens and a third lens arranged on the second optical path,
   the first lens and the third lens being arranged to create a virtual image, associated with the pump light, at a virtual image plane inside the package.

2. The pump laser package of claim 1,
   where the third lens is a negative lens, and
   where the second lens and the third lens are separated by free-space inside the package.

3. The pump laser package of claim 1, where the WDM filter is to send a portion of the signal light on a fourth optical path in free-space inside the package, and
   where the pump laser package further comprises:

a photo-diode to receive the portion of the signal light on the fourth optical path,
where the photo-diode is arranged on the fourth optical path in free-space inside the package.

4. The pump laser package of claim 3, further comprising a fourth lens to direct the portion of the signal light to the photo-diode,
where the fourth lens is arranged on the fourth optical path in free-space inside the package.

5. The pump laser package of claim 1, where the first optical path and the second optical path are on opposite sides of the WDM filter.

6. The pump laser package of claim 1, where a wavelength of the signal light is approximately equal to 1550 nanometers and a wavelength of the pump light is approximately equal to 980 nanometers.

7. The pump laser package of claim 1, where the WDM filter is arranged to receive the signal light on a first side of the WDM filter and receive the pump light on a second side of the WDM filter,
where the WDM filter is to reflect either the signal light received on the first side or at least partially reflect the pump light received on the second side.

8. The pump laser package of claim 1, where the package forms a portion of a fiber pigtail to the source.

9. A pump laser package, comprising:
an input fiber to send signal light on a first optical path in free-space inside a package;
a source to send pump light on a second optical path in free-space inside the package;
an output fiber on a third optical path in free-space inside the package;
a wavelength division multiplexing (WDM) filter to:
receive the signal light on the first optical path, send a first portion of the signal light on the third optical path, and send a second portion of the signal light on a fourth optical path in free-space inside the package, and
receive the pump light on the second optical path and send the pump light on the third optical path;
a photo-diode to receive the second portion of the signal light on the fourth optical path;
a first lens arranged on the first optical path and the third optical path; and
a second lens and a third lens arranged on the second optical path,
the first lens and the third lens being arranged to create a virtual image, associated with the pump light, at a virtual image plane inside the package.

10. The pump laser package of claim 9, further comprising:
an isolator, arranged on the first optical path, to:
transmit the signal light in a first direction on the first optical path, and
block the signal light in a second direction on the first optical path.

11. The pump laser package of claim 9,
where the third lens is a negative lens, and
where the second lens and the third lens are separated by free-space inside the package.

12. The pump laser package of claim 9, where the photo-diode is arranged on the fourth optical path in free-space inside the package.

13. The pump laser package of claim 9, further comprising a fourth lens to direct the second portion of the signal light to the photo-diode,
where the fourth lens is arranged on the fourth optical path in free-space inside the package.

14. The pump laser package of claim 9, where the first optical path and the second optical path are on opposite sides of the WDM filter.

15. The pump laser package of claim 9, where a wavelength of the signal light is approximately equal to 1550 nanometers and a wavelength of the pump light is approximately equal to 980 nanometers.

16. The pump laser package of claim 9, where the WDM filter is arranged to receive the signal light on a first side of the WDM filter and receive the pump light on a second side of the WDM filter,
where the WDM filter is to reflect either the signal light received on the first side or at least partially reflect the pump light received on the second side.

17. A pump laser package, comprising:
a first fiber to send signal light on a first optical path in free-space inside a package;
a source to send pump light on a second optical path in free-space inside the package;
a second fiber on a third optical path in free-space inside the package;
a wavelength division multiplexing (WDM) filter inside the package to:
receive the signal light on the first optical path and send the signal light on the third optical path, and
receive the pump light on the second optical path and send the pump light on the first optical path;
a first lens arranged on the first optical path and the third optical path; and
a second lens and a third lens arranged on the second optical path,
the first lens and the third lens being arranged to create a virtual image, associated with the pump light, at a virtual image plane inside the package.

18. The pump laser package of claim 17, further comprising:
an isolator inside the package to:
transmit the signal light in a first direction on the third optical path, and
block the signal light in a second direction on the third optical path.

19. The pump laser package of claim 17,
where the third lens is a negative lens, and
where the second lens and the third lens are separated by free-space inside the package.

20. The pump laser package of claim 17, where the WDM filter is arranged to receive the signal light on a first side of the WDM filter and receive the pump light on a second side of the WDM filter,
where the first side and the second side are opposite sides of the WDM filter, and
where the WDM filter is to reflect either the signal light received on the first side or at least partially reflect the pump light received on the second side.

* * * * *